US011024518B2

(12) United States Patent
Ito et al.

(10) Patent No.: US 11,024,518 B2
(45) Date of Patent: Jun. 1, 2021

(54) SUBSTRATE PROCESSING APPARATUS, SUBSTRATE PROCESSING METHOD AND RECORDING MEDIUM

(71) Applicant: Tokyo Electron Limited, Tokyo (JP)

(72) Inventors: Norihiro Ito, Koshi (JP); Jiro Higashijima, Koshi (JP); Nobuhiro Ogata, Koshi (JP); Takahisa Otsuka, Koshi (JP); Yuichi Douki, Koshi (JP); Yusuke Hashimoto, Koshi (JP); Kazuhiro Aiura, Koshi (JP); Daisuke Goto, Koshi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 374 days.

(21) Appl. No.: 15/747,921

(22) PCT Filed: Jul. 28, 2016

(86) PCT No.: PCT/JP2016/072157
§ 371 (c)(1),
(2) Date: Jan. 26, 2018

(87) PCT Pub. No.: WO2017/018481
PCT Pub. Date: Feb. 2, 2017

(65) Prior Publication Data
US 2018/0221925 A1 Aug. 9, 2018

(30) Foreign Application Priority Data

Jul. 29, 2015 (JP) .................................. 2015-149916
Jun. 21, 2016 (JP) ............................ JP2016-122690

(51) Int. Cl.
B08B 3/02 (2006.01)
H01L 21/67 (2006.01)
(Continued)

(52) U.S. Cl.
CPC .......... *H01L 21/67051* (2013.01); *B08B 3/02* (2013.01); *B08B 17/025* (2013.01);
(Continued)

(58) Field of Classification Search
CPC ......... H01L 21/68785; H01L 21/67017; H01L 21/67034; H01L 21/67051; B08B 2203/0264; B08B 17/025
See application file for complete search history.

(56) References Cited

U.S. PATENT DOCUMENTS 6,447,608 B1 * 9/2002 Sakai ...................... B05C 11/08
118/52
2009/0090391 A1 * 4/2009 Edamoto ........... H01L 21/67051
134/18
(Continued)

FOREIGN PATENT DOCUMENTS

JP 3917384 B2 * 5/2007
JP 2008-053690 A 3/2008
(Continued)

OTHER PUBLICATIONS

English Machine Translation of JP 2008-159871 A.*
(Continued)

*Primary Examiner* — Joseph L. Perrin
*Assistant Examiner* — Kevin G Lee
(74) *Attorney, Agent, or Firm* — Pearne & Gordon LLP

(57) ABSTRACT

A substrate processing apparatus includes a stationary cup body 51 provided to surround a substrate holding unit 31 and configured to receive a processing liquid or mist of the processing liquid discharged onto a substrate, the stationary cup body not being moved relatively with respect to a processing vessel; a mist guard 80; and a guard elevating mechanism 84 configured to elevate the mist guard. Here, the mist guard is provided at an outside of the stationary cup (Continued)

body to surround the stationary cup body and configured to block a liquid scattered outwards beyond a space above the stationary cup body. Further, the mist guard includes a cylindrical portion 81 of a cylindrical shape and a protruding portion 82 protruded from an upper portion of the cylindrical portion toward an inside of the cylindrical portion.

16 Claims, 12 Drawing Sheets

(51) Int. Cl.
    *B08B 17/02*      (2006.01)
    *H01L 21/687*      (2006.01)
    *B08B 3/08*      (2006.01)
    *H01L 21/02*      (2006.01)

(52) U.S. Cl.
CPC ............... *B08B 3/022* (2013.01); *B08B 3/08* (2013.01); *B08B 2203/0264* (2013.01); *H01L 21/02052* (2013.01); *H01L 21/68764* (2013.01)

(56) References Cited

U.S. PATENT DOCUMENTS

| | | |
|---|---|---|
| 2012/0260946 A1 | 10/2012 | Ogata et al. |
| 2013/0008872 A1 | 1/2013 | Higashuima et al. |
| 2014/0144465 A1 | 5/2014 | Kaneko |
| 2014/0261570 A1 | 9/2014 | Orii et al. |
| 2017/0084470 A1* | 3/2017 | Suzuki ............. H01L 21/67051 |
| 2017/0154796 A1* | 6/2017 | Aomatsu ........... H01L 21/67051 |

FOREIGN PATENT DOCUMENTS

| | | |
|---|---|---|
| JP | 2008-159871 A | 7/2008 |
| JP | 2009-059895 A | 3/2009 |
| JP | 2010-232528 A | 10/2010 |
| JP | 2014-123704 A | 7/2014 |
| JP | 2015-041672 A | 3/2015 |
| JP | 5967519 B2 * | 8/2016 |
| TW | 201312678 A | 3/2013 |
| TW | 201324649 A | 6/2013 |
| TW | 201448018 A | 12/2014 |

OTHER PUBLICATIONS

Machine translation of JP-5967519-B2, dated Aug. 2016. (Year: 2016).*

Machine translation of JP-2010232528-A, dated Oct. 2010. (Year: 2020).*

International Search Report for PCT/JP2016/072157 dated Sep. 20, 2016.

* cited by examiner

SUBSTRATE PROCESSING APPARATUS, SUBSTRATE PROCESSING METHOD AND RECORDING MEDIUM

CROSS-REFERENCE TO RELATED APPLICATION

This Application is a U.S. national phase application under 35 U.S.C. § 371 of PCT Application No. PCT/JP2016/072157 filed on Jul. 28, 2016, which claims the benefit of Japanese Patent Application Nos. 2015-149916 and 2016-122690 filed on Jul. 29, 2015 and Jun. 21, 2016, respectively, the entire disclosures of which are incorporated herein by reference.

TECHNICAL FIELD

The various embodiments described herein pertain generally to a technique of performing a liquid processing on a substrate by supplying a processing liquid onto the substrate being rotated.

BACKGROUND ART

A manufacturing process of a semiconductor device includes a liquid processing such as a chemical liquid cleaning processing or a wet etching processing. As a liquid processing apparatus configured to perform the liquid processing on a substrate such as a semiconductor wafer, there is known an apparatus including: a holding unit configured to hold the substrate within a processing vessel called a chamber; a rotating device configured to rotate the substrate such as a semiconductor wafer; a nozzle configured to supply a processing liquid onto the substrate being rotated; and a cup configured to receive the processing liquid scattered from the substrate.

Though most of the processing liquid supplied onto the substrate is collected by the cup, a part of the processing liquid turned into mist may be scattered to the outside of the cup. If this scattered processing liquid adheres to an inner wall of the chamber, an atmosphere originated from the processing liquid, particularly, from a chemical liquid may be generated around the substrate, and a chemical liquid component in this atmosphere may adhere to the substrate being liquid-processed, resulting in contamination of the substrate. Further, if moisture adheres to the inner wall of the chamber, humidity around the substrate may be increased, resulting in an adverse effect on a drying processing of the substrate.

Thus, it is desirable to suppress the processing liquid scattered from the substrate to the outside of the cup from adhering to the inner wall of the chamber.

Patent Document 1: Japanese Patent Laid-open Publication No. 2008-053690

DISCLOSURE OF THE INVENTION

Problems to be Solved by the Invention

In view of the foregoing, exemplary embodiments provide a technique capable of suppressing the processing liquid scattered from the substrate to the outside of the cup from adhering to the inner wall of the chamber.

Means for Solving the Problems

In one exemplary embodiment, there is provided a substrate processing apparatus including a substrate holding unit configured to hold a substrate; at least one processing liquid nozzle configured to discharge a processing liquid onto the substrate held by the substrate holding unit; a processing vessel configured to accommodate therein the substrate holding unit and the at least one processing liquid nozzle; a stationary cup body disposed around the substrate holding unit and configured to receive at least the processing liquid or mist of the processing liquid discharged onto the substrate, the stationary cup body not being moved relatively with respect to the processing vessel; a mist guard provided at an outside of the stationary cup body to surround the stationary cup body and configured to block a liquid scattered outwards beyond a space above the stationary cup body; and a guard elevating mechanism configured to elevate the mist guard to a first guard height and a second guard height lower than the first guard height. Here, the mist guard includes a cylindrical portion of a cylindrical shape and a protruding portion protruded above the stationary cup body from an upper portion of the cylindrical portion toward an inside of the cylindrical portion.

In another exemplary embodiment, there is provided a substrate processing method performed by using a substrate processing apparatus. The substrate processing apparatus includes a substrate holding unit configured to hold a substrate; at least one processing liquid nozzle configured to discharge a processing liquid onto a top surface of the substrate held by the substrate holding unit; a processing vessel configured to accommodate therein the substrate holding unit and the at least one processing liquid nozzle; a stationary cup body disposed around the substrate holding unit and configured to receive the processing liquid or mist of the processing liquid discharged onto the substrate, the stationary cup body not being moved relatively with respect to the processing vessel; a mist guard provided at an outside of the stationary cup body to surround the stationary cup body and configured to block a liquid scattered outwards beyond a space above the stationary cup body; and a guard elevating mechanism configured to elevate the mist guard. Here, the mist guard includes a cylindrical portion of a cylindrical shape and a protruding portion protruded from an upper end of the cylindrical portion toward the stationary cup body. The substrate processing method includes supplying the processing liquid onto the substrate held by the substrate holding unit from the at least one processing liquid nozzle in a state that the mist guard is located at a first guard height; and drying the substrate in a state that the mist guard is located at a second guard height lower than the first guard height.

In still another exemplary embodiment, there is provided a computer-readable recording medium having stored thereon computer-executable instructions that, in response to execution by a computer constituting a control device of a substrate processing apparatus, cause the substrate processing apparatus to perform the substrate processing method.

Effect of the Invention

According to the exemplary embodiments, by providing the mist guard having the protruding portion, it is possible to suppress the processing liquid scattered over the cup from adhering to the inner wall of the processing vessel.

DETAILED DESCRIPTION

Figure 1:
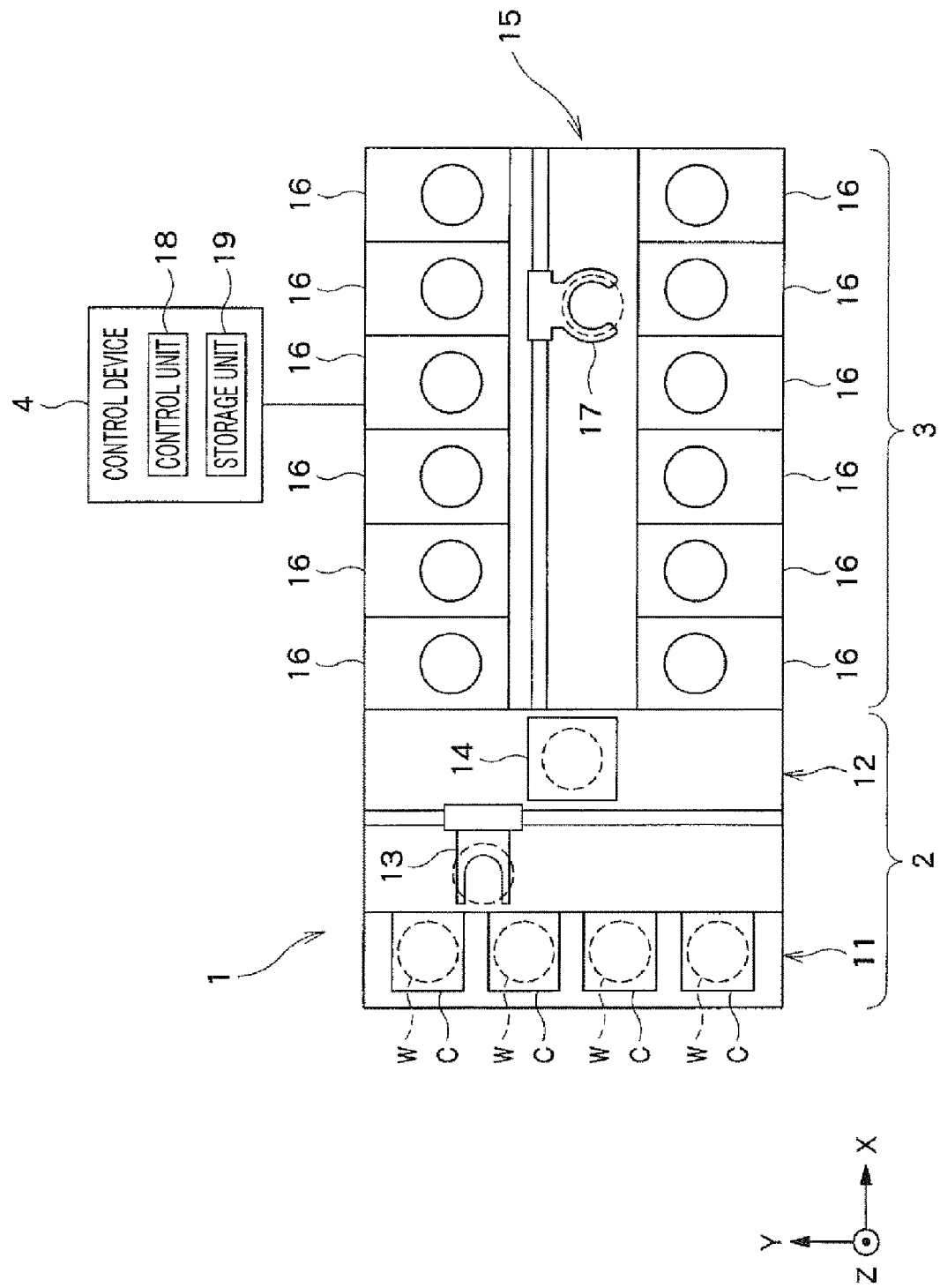
FIG. 1 is a plan view illustrating an outline of a substrate processing system according to an exemplary embodiment.

FIG. 1 is a plan view illustrating an outline of a substrate processing system provided with a processing unit according to an exemplary embodiment of the present disclosure. In the following, in order to clarify positional relationships, the X-axis, Y-axis and Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and the processing station 3 are provided adjacent to each other.

The carry-in/out station 2 is provided with a carrier placing section 11 and a transfer section 12. In the carrier placing section 11, a plurality of carriers C is placed to accommodate a plurality of wafers horizontally.

The transfer section 12 is provided adjacent to the carrier placing section 11, and provided with a substrate transfer device 13 and a delivery unit 14. The substrate transfer device 13 is provided with a substrate holding mechanism configured to hold the wafer W. Further, the substrate transfer device 13 is movable horizontally and vertically and pivotable around a vertical axis, and transfers the wafers W between the carriers C and the delivery unit 14 by using the substrate holding mechanism.

The processing station 3 is provided adjacent to the transfer section 12. The processing station 3 is provided with a transfer section 15 and a plurality of processing units 16. The plurality of processing units 16 is arranged at both sides of the transfer section 15.

The transfer section 15 is provided with a substrate transfer device 17 therein. The substrate transfer device 17 is provided with a substrate holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the substrate holding mechanism.

The processing units 16 perform a predetermined substrate processing on the wafers W transferred by the substrate transfer device 17.

Further, the substrate processing system 1 is provided with a control device 4. The control device 4 is, for example, a computer, and includes a control unit 18 and a storage unit 19. The storage unit 19 stores a program that controls various processings performed in the substrate processing system 1. The control unit 18 controls the operations of the substrate processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing section 11, and then places the taken wafer W on the delivery unit 14. The wafer W placed on the delivery unit 14 is taken out from the delivery unit 14 by the substrate transfer device 17 of the processing station 3 and carried into a processing unit 16.

The wafer W carried into the processing unit 16 is processed by the processing unit 16, and then, carried out from the processing unit 16 and placed on the delivery unit 14 by the substrate transfer device 17. After the processing of placing the wafer W on the delivery unit 14, the wafer W returns to the carrier C of the carrier placing section 11 by the substrate transfer device 13.

Figure 2:
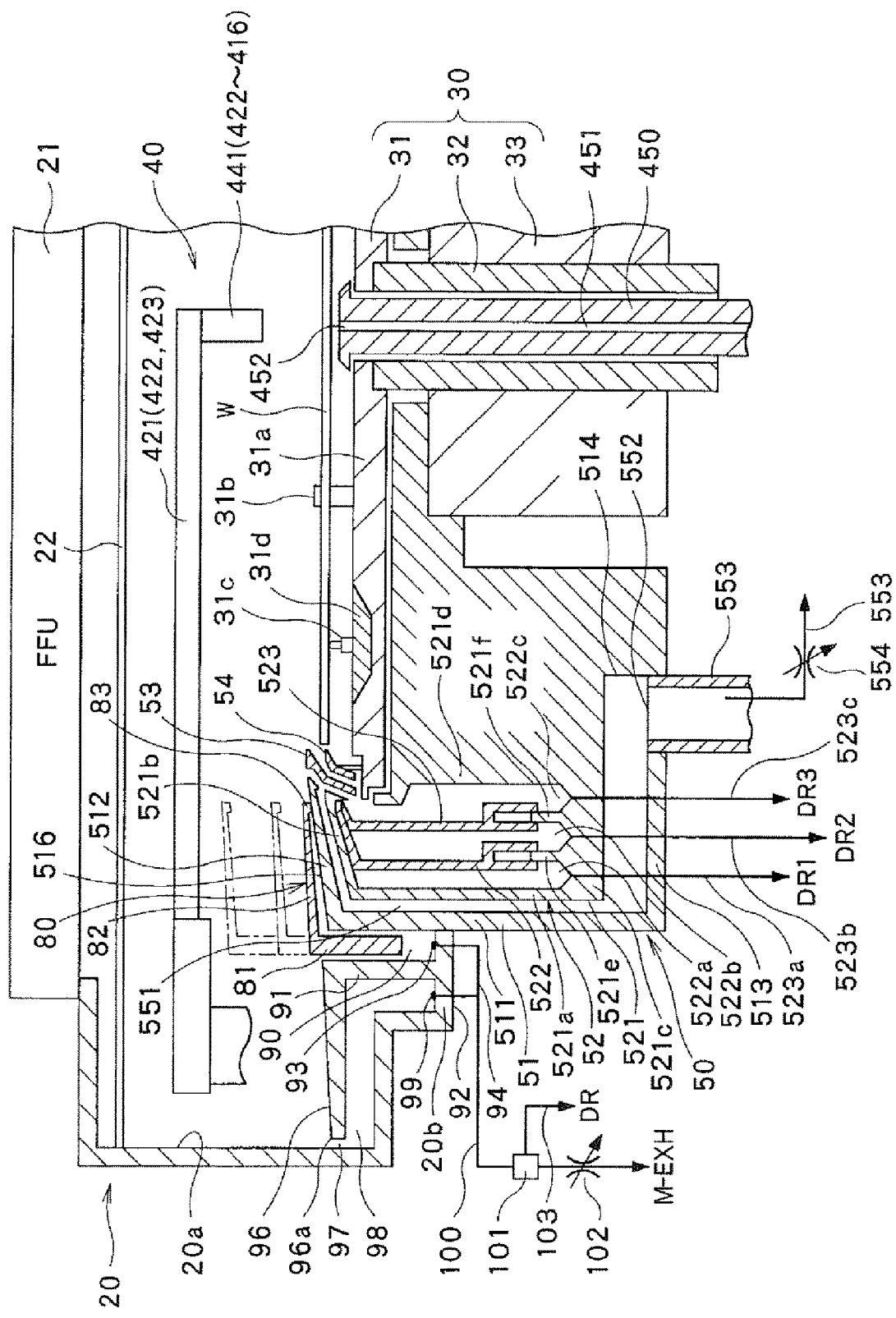
FIG. 2 is a longitudinal cross sectional view illustrating a configuration of a processing unit.

Now, a configuration of the processing unit 16 will be explained with reference to FIG. 2. FIG. 2 is a diagram schematically illustrating a configuration of the processing unit 16. As depicted in FIG. 2, the processing unit 16 is equipped with a chamber 20, a substrate holding mechanism 30, a processing fluid supply unit 40 and a cup 50. The processing fluid supply unit 40 is configured to supply a processing fluid onto the wafer W.

The chamber 20 accommodates therein the substrate holding mechanism 30, the processing fluid supply unit 40 and the cup 50. A fan filter unit (FFU) 21 is provided on the ceiling of the chamber 20. The FFU 21 forms a downflow in the chamber 20. A rectifying plate 22 provided with a multiple number of holes (not shown) is provided directly under a discharge opening of the FFU 21 to optimize a distribution of a downflow gas flowing within the chamber 20.

The substrate holding mechanism 30 is provided with a holding unit (substrate holding unit) 31, a rotation shaft 32, and a driving unit 33. The holding unit 31 is configured to hold the wafer W horizontally. The driving unit 33 is configured to rotate the holding unit 31 via the rotation shaft 32, so that the wafer W held by the holding unit 31 is rotated around a vertical axis line.

The holding unit 31 includes a circular plate-shaped base plate 31a; multiple holding members 31b for holding the wafer W which are provided at the base plate 31a; and a lift pin 31c configured to support a bottom surface of the wafer W which is distanced apart from the holding members 31b when the wafer W is carried into and out of the processing unit 16. The holding members 31b may be implemented by, by way of non-limiting example, movable holding claws provided at the base plate 31a and configured to hold and release a peripheral portion of the wafer W, or may be implemented by holding pins fixed to the base plate 31a.

The lift pins 31c are fixed to a ring-shaped lift pin plate 31d fitted into a recess formed on a top surface of the base plate 31a. The lift pine plate 31d is configured to lift up the wafer W by being raised through a non-illustrated elevating mechanism. The wafer W can be transferred between an arm of the substrate transfer device 17 advanced into the chamber 20 and the raised lift pin plate 31d.

Below, the cup (cup assembly) 50 will be elaborated. The cup 50 has a function of collecting a processing liquid scattered from the wafer W and controlling an air flow around the wafer W. The cup 50 is disposed to surround the holding unit 31 and has a shape of substantially a rotating body (in a geometric sense). The cup 50 is composed of multiple constituent components. The cup 50 is equipped with a stationary (fixed) gas exhaust cup 51 provided at an outermost side; and a liquid drain cup 52 for guiding the processing liquid provided inside the gas exhaust cup 51.

Further, a first rotating cup 53 and a second rotating cup 54 are mounted to the base plate 31a of the holding unit 31 and are rotated along with the base plate 31a. The first rotating cup 53 and the second rotating cup 54 are configured to receive a liquid scattered outwards from the wafer W after being supplied onto a front surface (top surface) of the wafer W to guide the received liquid diagonally downwards (outwards in a radial direction and, also, downwardly). The second rotating cup 54 also has a function of guiding a liquid scattered outwards from the wafer W after being supplied onto a rear surface (bottom surface) of the wafer W. Further, the first rotating cup 53 and the second rotating cup 54 also have a function of controlling the air flow around the wafer W.

The liquid drain cup 52 is equipped with a liquid drain cup main body 521, a first movable cup member 522 (first movable cup body), and a second movable cup member 523 (second movable cup body). The liquid drain cup main body 521 has a substantially vertically extended outer cylindrical portion 521a; a protruding portion 521b; a bottom portion 521c; and an inner peripheral portion 521d. The protruding portion 521b is extended toward the wafer W from an upper end of the outer cylindrical portion 521a. Two protruding portions 521e and 521f are extended upwards from the bottom portion 521c.

A liquid storage portion 522a for collecting acidic liquid is formed between the outer cylindrical portion 521a and the protruding portion 521e; a liquid storage portion 522b for collecting alkaline liquid is formed between the protruding portion 521e and the protruding portion 521f; and a liquid storage portion 522c for collecting organic liquid is formed between the protruding portion 521f and the inner peripheral portion 521d. The liquid storage portions 522a, 522b and 522c are respectively connected to factory waste liquid systems for an acidic liquid DR1, an alkaline liquid DR2 and an organic liquid DR3 via liquid drain lines 523a, 523b and 523c which are respectively connected to the liquid storage portions 522a, 522b and 522c.

The first movable cup member 522 and the second movable cup member 523 are respectively engaged with the protruding portions 521e and 521f in a vertically movable manner. The first movable cup member 522 and the second movable cup member 523 are configured to be moved up and down by a non-illustrated elevating mechanism. By changing positions of the first movable cup member 522 and the second movable cup member 523, the processing liquid guided into the first rotating cup 53 and the second rotating cup 54 after being scattered outwards from the wafer W can be introduced into the corresponding liquid storage portion (one of the liquid storage portions 522a, 522b and 522c).

The gas exhaust cup 51 is provided with an outer cylindrical portion 511, a protruding portion 512, a bottom portion 513, and an inner peripheral portion 514. A gas exhaust passage 551 is formed between mutually facing surfaces of the gas exhaust cup 51 and the liquid drain cup main body 521. A gas exhaust opening 552 is provided at the bottom portion 513 of the gas exhaust cup 51, and a gas exhaust duct (gas exhaust path) 553 is connected to the gas exhaust opening 552. The gas exhaust duct 553 is connected to a factory exhaust duct (not shown) of a factory gas exhaust system having a decompressed atmosphere (C-EXH). The gas exhaust duct 553 is equipped with a flow rate control valve 554 such as a butterfly valve or a damper. By adjusting an opening degree of the flow rate control valve 554, a flow rate of a gas sucked through the gas exhaust passage 551 can be adjusted. Further, the gas exhaust duct 553 may be provided with a device capable of facilitating a gas exhaust, such as an ejector or a gas exhaust pump.

Now, the processing fluid supply unit 40 will be explained. The processing fluid supply unit 40 is equipped with multiple nozzles each configured to supply a processing fluid (a gas or a liquid). These multiple nozzles include, as shown in FIG. 3, a SC1 nozzle 411 configured to discharge a SC1 liquid; an AS nozzle 412 configured to discharge a dual fluid containing a liquid droplet of DIW (pure water) and a nitrogen gas; a DHF nozzle 413 configured to discharge DHF (Diluted Hydrofluoric acid); a first DIW nozzle 414 configured to discharge pure water (DIW); an IPA nozzle 415 configured to discharge warmed IPA (Isopropyl Alcohol); a first nitrogen gas nozzle 416 configured to discharge a nitrogen gas vertically downwards; a second nitrogen gas nozzle 417 configured to discharge a nitrogen gas diagonally downwards; a SC2 nozzle 418 configured to discharge a SC2 liquid; and a second DIW nozzle 419 configured to discharge pure water (DIW).

The AS nozzle 412 is configured to turn the DIW into mist by allowing the DIW to join a flow of the nitrogen gas and discharge the dual fluid containing the misty DIW and the nitrogen gas. By supplying only the DIW into the AS nozzle 412 without supplying the nitrogen gas, the AS nozzle 412 can discharge only the DIW which is not turned into the mist. The IPA nozzle 415 discharges a solvent, other than the DIW, which is compatible with the DIW and has higher volatility and lower surface tension than the DIW.

The SC1 nozzle 411 and the AS nozzle 412 are held by a first nozzle arm 421. The DHF nozzle 413, the first DIW nozzle 414 and the IPA nozzle 415 are held by a second nozzle arm 422. The first nitrogen gas nozzle 416 and the second nitrogen gas nozzle 417 are held by a third nozzle arm 423. The first to third nozzle arms 421 to 423 are configured to be rotatable around vertical axis lines and vertically elevated by arm driving mechanisms 431, 432 and 433 respectively provided at the nozzle arms 421 to 423. Each of the arm driving mechanism 431, 432 and 433 may be equipped with, for example, a rotation motor (not shown) as a rotation driving mechanism configured to implement the aforementioned rotating motion, and an air cylinder (not shown) as an elevating mechanism (arm elevating mechanism) configured to implement the aforementioned elevating motion.

Figure 3:
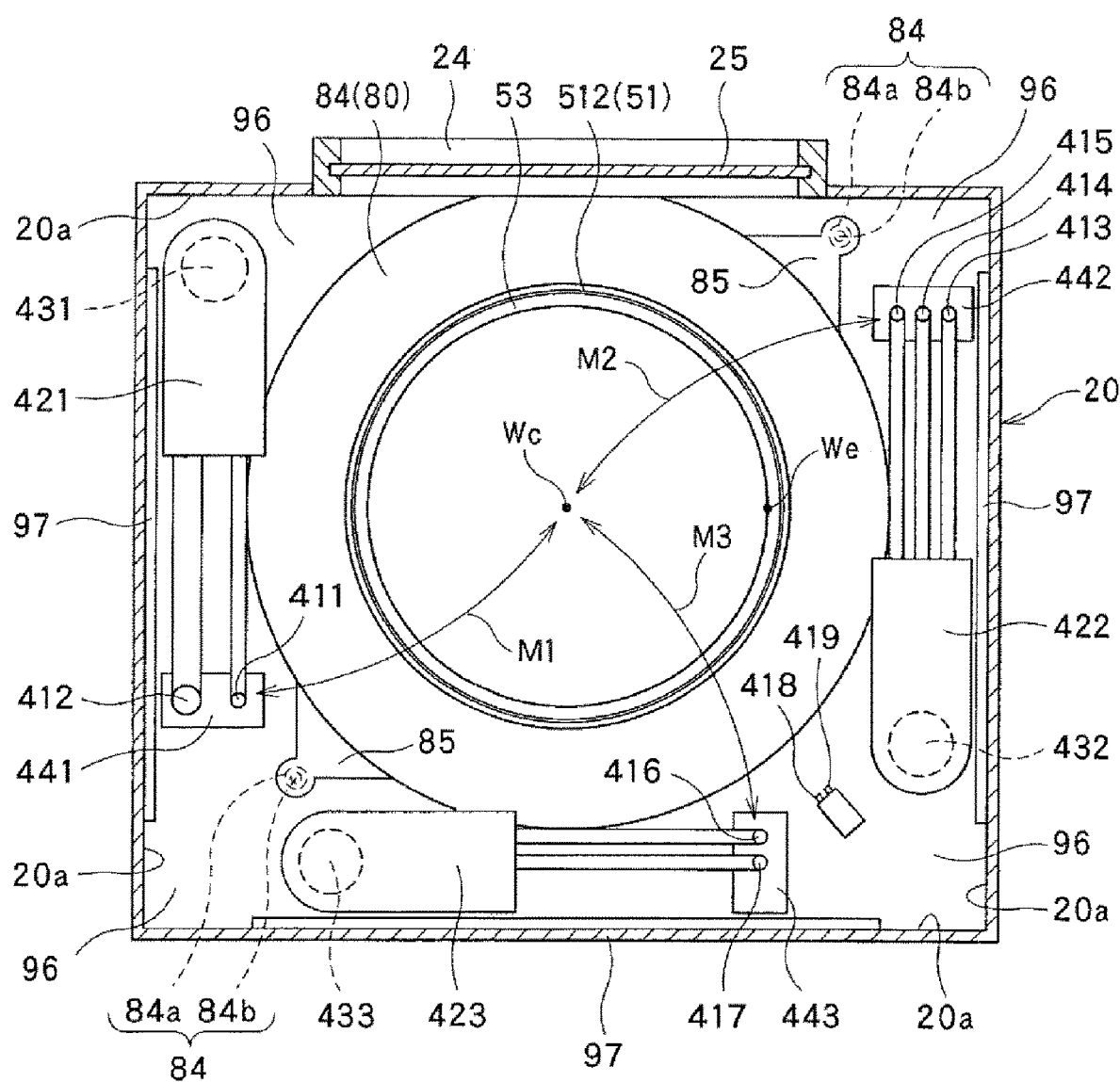
FIG. 3 is a plan view illustrating the configuration of the processing unit.

By rotating the first nozzle arm 421 by the arm driving mechanism 431, the SC1 nozzle 411 and the AS nozzle 412 can be located at a preset position between a standby place 441 outside the cup 50 and a position directly above a central portion Wc of the wafer W (see an arrow M1 of FIG. 3). By rotating the second nozzle arm 422 through the arm driving mechanism 432, the DHF nozzle 413, the first DIW nozzle 414 and the IPA nozzle 415 can be located at a predetermined position between a standby place 442 outside the cup 50 and the position directly above the central portion Wc of the wafer W (see an arrow M2 of FIG. 3). By rotating the third nozzle arm 423 through the arm driving mechanism 433, the first nitrogen gas nozzle 416 and the second nitrogen gas nozzle 417 can be located at a preset position between a standby place 443 outside the cup 50 and the position directly above the central portion Wc of the wafer W (see an arrow M3 of FIG. 3).

In the present specification, for the simplicity of explanation, positions directly above the standby places 441, 442 and 443 are referred to as home positions of the corresponding nozzles 411 to 417, and positions of the nozzle arms 421, 422 and 423 at a time when the corresponding nozzles 411 to 417 are located at the corresponding home positions are referred to as home positions of the corresponding nozzle arms.

Figure 4A:
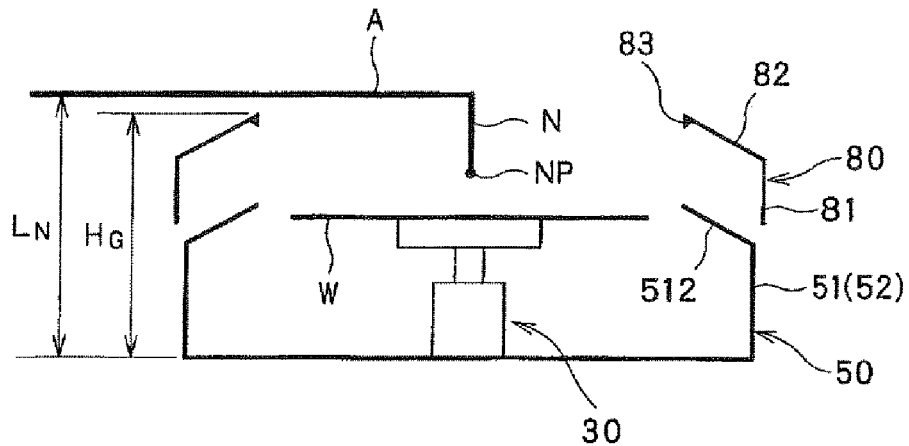
FIG. 4A to FIG. 4C are schematic diagrams for describing movements of a mist guard and a nozzle arm.
Figure 4B:
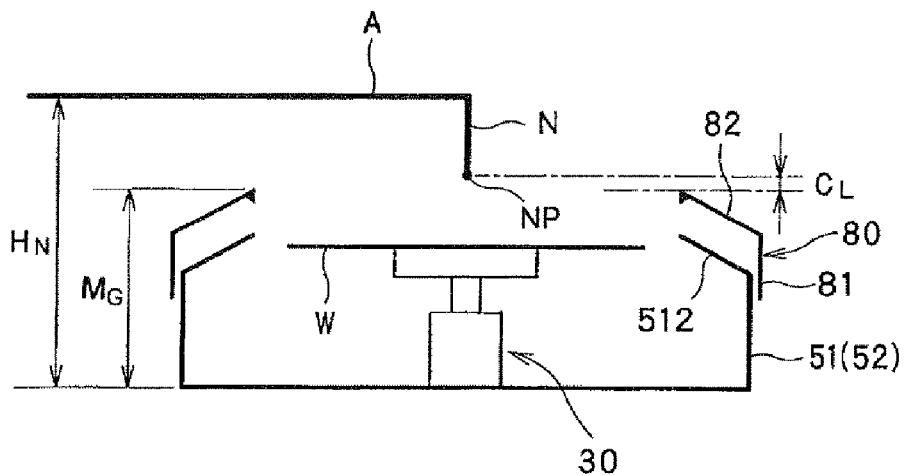
Figure 4C:
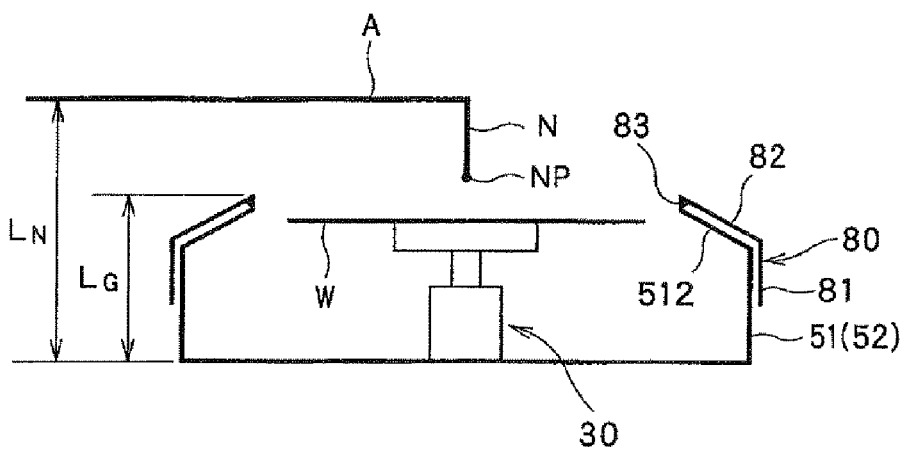

Each nozzle arm 421 (422, 423) can be moved between a high position $H_N$ (a first (third) arm height) and a low position $L_N$ (a second (fourth) arm height) by the arm elevating mechanism of the corresponding arm driving mechanism 431 (432, 433) (see FIG. 4A to FIG. 4C). Accordingly, the nozzle held by the corresponding nozzle arm can be moved between an adjacent position where the nozzle is adjacent to the wafer W and a distanced position where the nozzle is apart from the wafer W farther than it is at the adjacent position.

The SC2 nozzle 418 and the second DIW nozzle 419 are stationary nozzles, which are not moved, and are fixed on a bottom plate 96 to be described later. The SC2 nozzle 418 and the second DIW nozzle 419 are configured to discharge the corresponding liquids at predetermined flow rates such that the liquids discharged from the nozzles 418 and 419 fly in a parabolic curve and fall on the central portion Wc of the wafer W.

A cylindrical body 450 is vertically extended within the rotation shaft 32. The cylindrical body 450 is configured not to be rotated even when the rotation shaft 32 is rotated. A single or multiple processing fluid supply paths 451 (only one is illustrated in FIG. 2) are vertically extended within the cylindrical body 450. An upper end opening of the processing fluid supply path 451 serves as a bottom surface nozzle 452 for supplying the processing fluid. By way of example, DIW as a rinse liquid or a purge liquid, or a nitrogen gas as a drying gas or the purge gas can be supplied from the bottom surface nozzle 452 to the rear surface (bottom surface) of the wafer W. In the following description, this bottom surface nozzle 452 will be no more mentioned.

One of the aforementioned processing fluids is supplied via a corresponding processing fluid supply mechanism (not shown) into the corresponding one of the nozzles 411 to 419 from a corresponding processing fluid supply source (for example, one (not shown) of various kinds of supply units such as a chemical liquid supply tank configured to store therein the SC1 or the DHF and a supply source of the pure water or the nitrogen gas supplied by a factory force). The processing fluid supply mechanism may be composed of a supply line connecting each of the nozzles 411 to 419 to the corresponding processing fluid supply source; a flow rate control device such as a flow rate control valve and an opening/closing valve provided at this supply line; and so forth.

The processing liquid supplied onto the wafer W being rotated from the processing liquid nozzle (the SC1 nozzle 411, the AS nozzle 412, the DHF nozzle 413, the first DIW nozzle 414, the SC2 nozzle 418, the second DIW nozzle 419, or the like) is shaken off from the wafer by a centrifugal force or by collision of the processing liquid onto the front surface of the wafer W (by collision between liquids when the liquids are supplied onto the front surface of the wafer W from two or more nozzles at the same time). Thus, the processing liquid is scattered as fine liquid droplets. If these scattered liquid droplets adhere to the inner wall surface of the chamber 20 or the constituent components within the chamber 20, the problems as mentioned in the description of the background art may be caused.

A mist guard 80 is provided farther outside of the cup 50 to suppress or at least to suppress greatly the scattered processing liquid from reaching the inner wall surface of the chamber 20.

The mist guard 80 is equipped with an outer cylindrical portion (cylindrical portion) 81, and a protruding portion 82 extended from an upper end of the outer cylindrical portion 81 toward an inner side of the outer cylindrical portion 81 (in a radial direction) to be protruded above the gas exhaust cup 51. A protrusion 83 projecting downwards is provided at a bottom surface of a tip end portion of the protruding portion 82.

The mist guard 80 is moved up and down by elevating mechanisms 84 (guard elevating mechanisms) (see FIG. 3) among three different height positions: a high position $H_G$ (a first guard height) (indicated by a dashed dotted line in FIG. 2), a low position $L_G$ (a second guard height) (indicated by a solid line in FIG. 2) and an intermediate position $M_G$ (a third guard height) (indicated by a dashed double-dotted line in FIG. 2) (see FIG. 4A to FIG. 4C). The elevating mechanism 84 is implemented by, by way of non-limiting example, air cylinders 84a provided at three different positions, as schematically illustrated in FIG. 3. The mist guard 80 has flange portions 85 protruded outwards from the outer cylindrical portion 81. Connected to the flange portions 85 are rods 84b of the air cylinders 84a located under the corresponding flange portions 85. As these rods 84b are advanced and retreated, the mist guard 80 is moved up and down. Alternatively, each elevating mechanism 84 may be implemented by a linear motor or a linearly moving mechanism driven by a rotation motor. In such a case, the mist guard 80 may be fixed at a certain height position.

Figure 5:
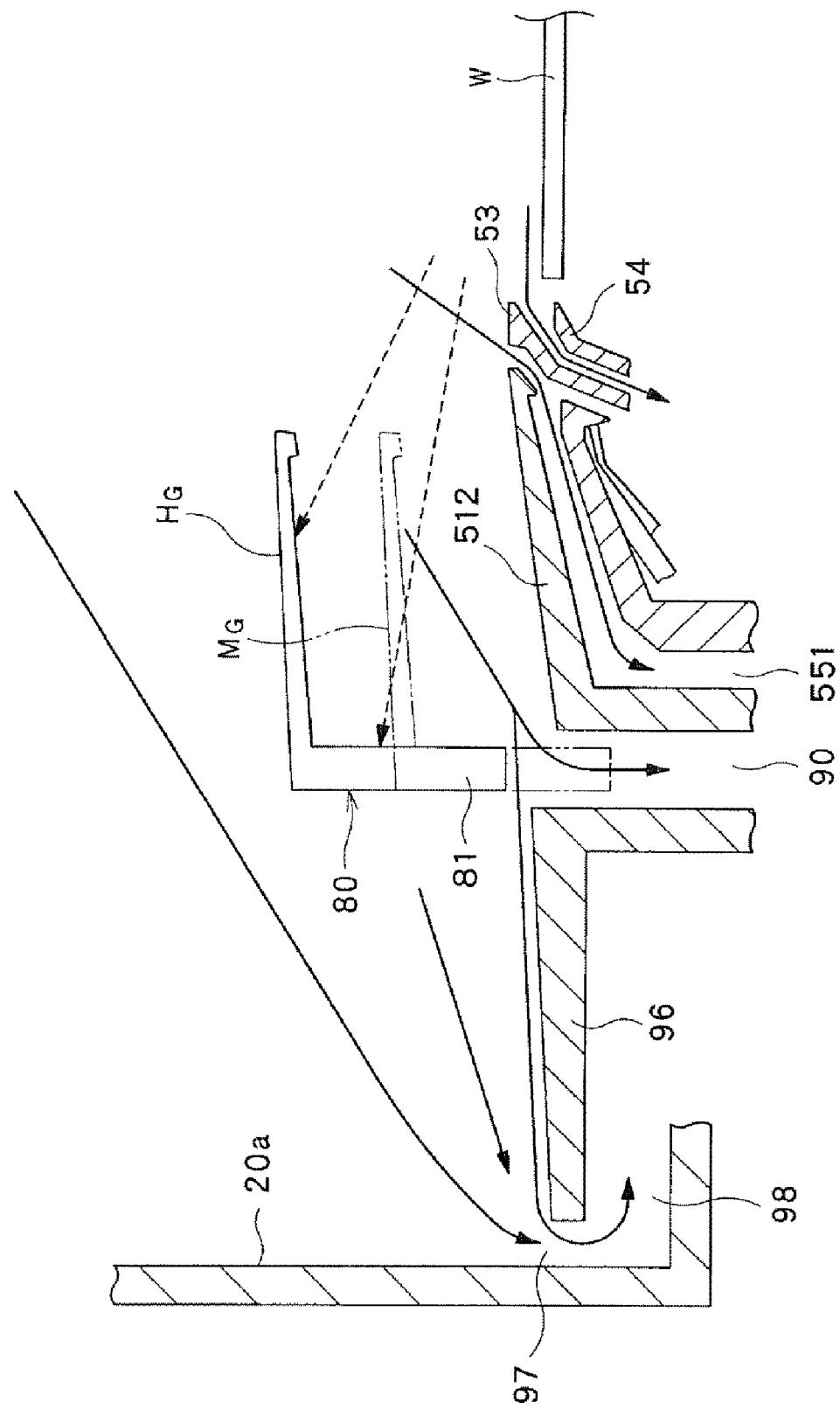
FIG. 5 is an explanatory diagram for describing movements of a gas and a liquid droplet when the mist guard is located at a high position and an intermediate position.

FIG. 5 illustrates the mist guard 80 located at the high position $H_G$. When located at the high position $H_G$, the mist guard 80 most effectively suppresses the processing liquid (indicated by dashed-line arrows in FIG. 5), which is scattered from the wafer W after being supplied onto the wafer W being rotated from the nozzle (the SC1 nozzle 411, the AS nozzle 412, the DHF nozzle 413, the first DIW nozzle 414, the SC2 nozzle 418, the second DIW nozzle 419, or the like), from reaching the inner wall of the chamber 20. A desirable height of the high position $H_G$ of the mist guard 80 may be differed depending on a rotation number of the wafer W, a supply condition (a flow rate, etc.) of the processing liquid onto the front surface of the wafer W, and the like, and may be determined by experiment. As an example, a height of a topmost portion of the mist guard 80 located at the high position $H_G$ may be higher than a height of the front surface of the wafer W by 60 mm. When the mist guard 80 is located at the high position $H_G$, as depicted in FIG. 4A, a discharge opening (assigned a reference numeral NP in FIG. 4A to FIG. 4C) of the nozzle (corresponding to any one of the nozzles 411 to 417 and assigned a reference numeral N in FIG. 4A to FIG. 4C) placed at the aforementioned adjacent position is located at a position lower than an inner circumferential end of the protruding portion 82 of the mist guard 80, and the nozzle arm (corresponding to any one of the nozzle arms 421 to 423 and assigned a reference numeral A in FIG. 4A to FIG. 4C) corresponding to the nozzle N is located above the protruding portion 82. Since the appropriate height of the high position $H_G$ of the mist guard 80 is differed depending on the rotation number of the wafer W, the supply condition (the flow rate, etc.) of the processing liquid onto the front surface of the wafer W, and so forth, it is desirable to determine the height of the high position $H_G$ based on these conditions.

Figure 6:
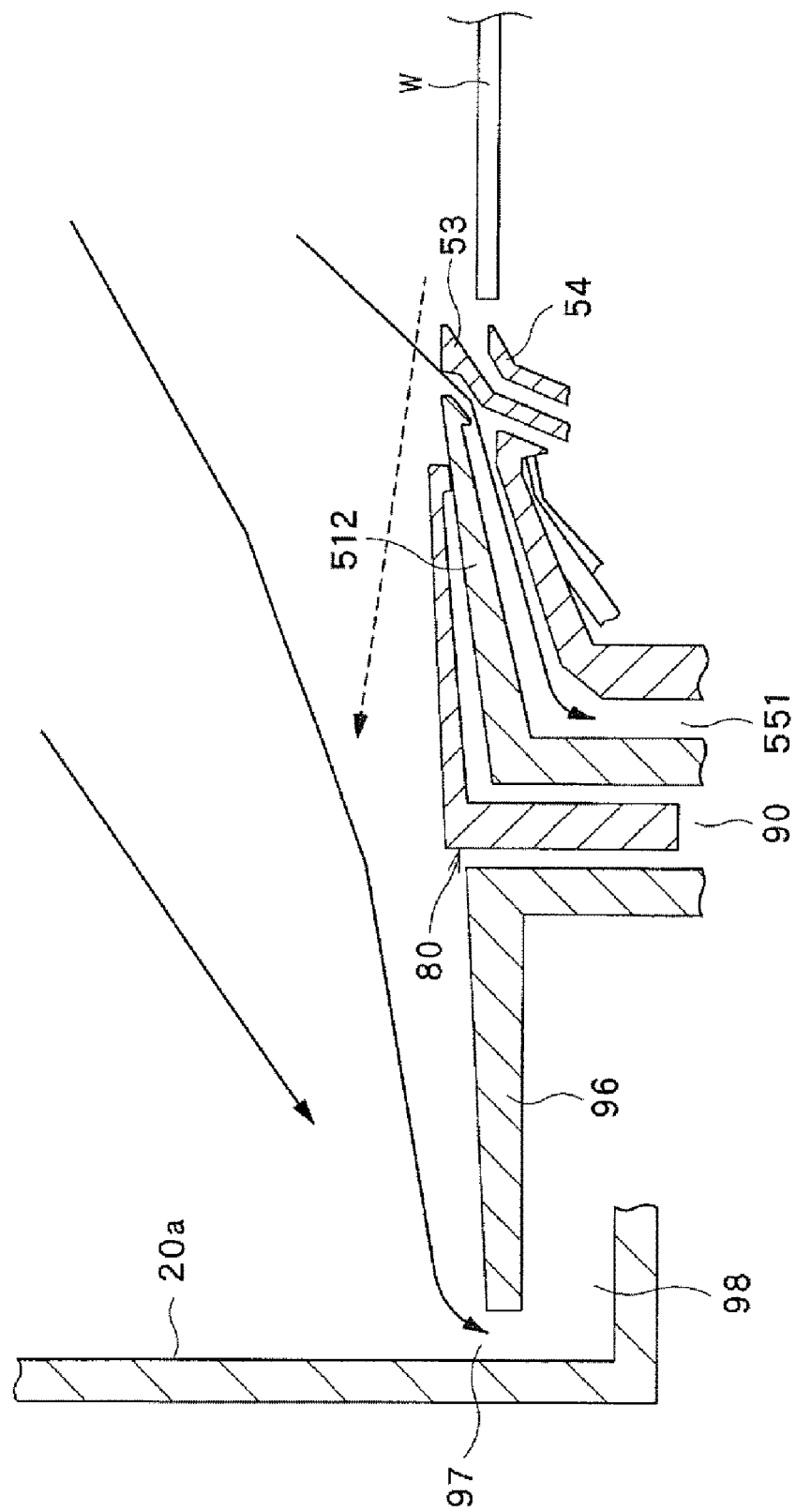
FIG. 6 is an explanatory diagram for describing movements of the gas and the liquid droplet when the mist guard is located at a low position.

FIG. 6 depicts the mist guard 80 located at the low position $L_G$. The low position $L_G$ is a lowermost position where the mist guard 80 can be located. When the mist guard 80 is located at the low position $L_G$, the protrusion 83 of the protruding portion 82 of the mist guard 80 is in contact with a top surface of the protruding portion 512 of the gas exhaust cup 51. That is, a space between mutually facing surfaces of the mist guard 80 and the gas exhaust cup 51 is isolated from a space above and in the vicinity of the wafer W. Further, when the mist guard 80 is placed at the low position $L_G$, a gas flow (indicated by solid-line arrows in FIG. 6) heading from the space above the wafer W toward a gas exhaust opening (a slit-shaped opening 97 to be described later) provided at a peripheral portion of the chamber 20 is not interfered by the mist guard 80.

The intermediate position $M_G$ of the mist guard 80 is located at a height position between the high position $H_G$ and low position $L_G$. In FIG. 5, the mist guard 80 located at the intermediate position $M_G$ is indicated by a dashed line. When the mist guard 80 is located at the intermediate position $M_G$, the protruding portion 82 of the mist guard 80 is distanced upwardly away from the protruding portion 512 of the gas exhaust cup 51 (though not as much as when the mist guard 80 is located at the high position $H_G$), so that it is possible to some extent to suppress the processing liquid scattered from the wafer W from reaching the inner wall of the chamber 20. Further, when the mist guard 80 is located at the intermediate position $M_G$, the discharge opening NP of the nozzle N (located at the aforementioned distanced position) is located at a position higher than the inner circumferential end of the protruding portion 82 of the mist guard 80, as shown in FIG. 4B, and the nozzle N is capable of freely moving between a position above the surface of the wafer W and the aforementioned standby place, beyond the space above the mist guard 80, without being interfered with the mist guard 80.

As stated above, since the arm driving mechanism 431 (432, 433) includes the elevating mechanism, by raising the nozzle arm 421 (422, 423) to the high position $H_N$ when the mist guard 80 is located at the intermediate position $M_G$, the corresponding nozzle can pass through the space above the mist guard 80 with a more sufficient clearance (without interference). That is, by providing the elevating mechanism at the arm driving mechanism, the intermediate position $M_G$ of the mist guard 80 can be set to be relatively high, so that the processing liquid supplied to the wafer W while the mist guard 80 is located at the intermediate position $M_G$ can be suppressed from being scattered over the mist guard 80. Furthermore, the discharge opening of the nozzle, while the mist guard 80 is located at the high position $H_G$ and the processing liquid is being supplied onto the wafer W from the nozzle, can be brought sufficiently close to the front surface of the wafer W, so that splashing of the processing liquid on the front surface of the wafer W can be suppressed.

In addition, though it is desirable, as stated above, to raise the nozzle arm 421 (422, 423) to the high position $H_N$ while the mist guard 80 is located at the intermediate position $M_G$, it may be also possible to keep the nozzle arm 421 (422, 423) at the low position $L_N$.

Figure 7:
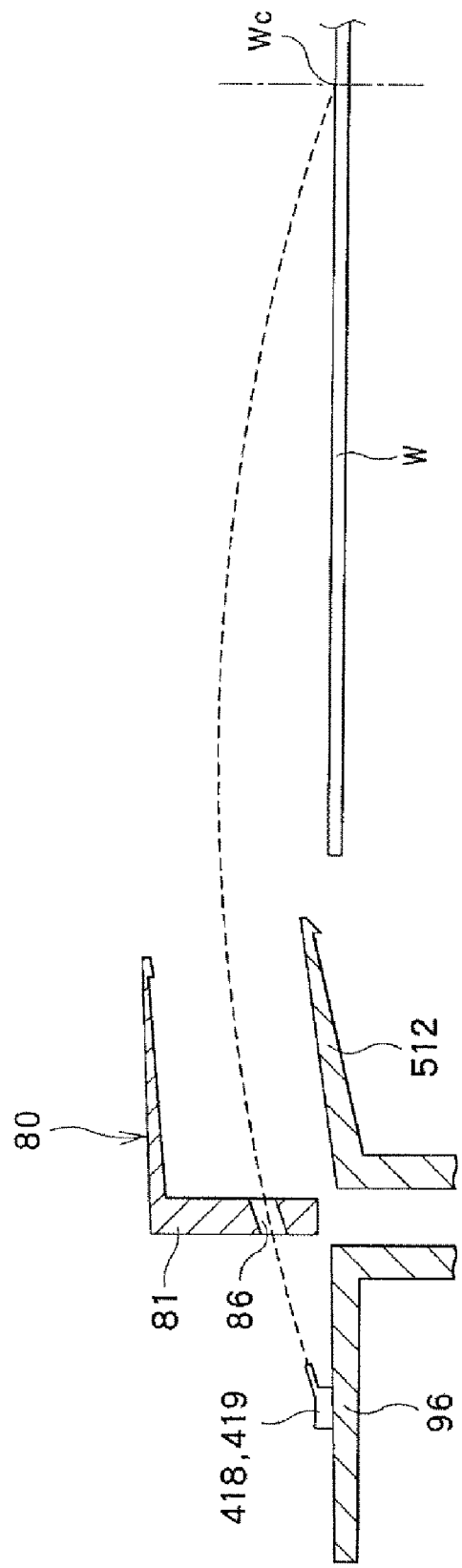
FIG. 7 is a schematic longitudinal cross sectional view for describing a liquid passage opening provided at the mist guard.

As depicted in FIG. 7, the outer cylindrical portion 81 of the mist guard 80 is provided with a liquid passage opening 86 at a position through which flight paths of the liquids discharged from the SC2 nozzle 418 and the second DIW nozzle 419 pass when the mist guard 80 is located at the high position.

As illustrated in FIG. 2, a cylindrical guard pocket 90 (mist guard accommodating portion) configured to accommodate the outer cylindrical portion 81 of the mist guard 80 is provided at an outside of the outer cylindrical portion 511 of the gas exhaust cup 51. The guard pocket 90 is formed by an outer peripheral surface of the outer cylindrical portion 511 of the gas exhaust cup 51, a cylindrical vertical wall 91 (longitudinal wall) facing the outer cylindrical portion 511 and a bottom wall 92. Multiple outlet openings 93 are formed through the bottom wall 92 at a regular distance in a circumferential direction (only one is shown in FIG. 2). The outlet openings 93 are connected to an outlet pipe 94 (outlet line).

A bottom plate 96 which partitions a bottom of a processing space formed within the chamber 20 is extended outwards in a substantially horizontal direction from the vertical wall 91 which forms the guard pocket 90. The bottom plate 96 surrounds the mist guard 80 along the entire circumference thereof. That is, an opening (corresponding to the vertical wall 91) having a diameter slightly larger than an outer form of the outer cylindrical portion 81 of the mist guard 80 is provided at the bottom plate 96, and the mist guard 80 and the cup 50 are accommodated in this opening. The bottom plate 96 is extended from this opening to reach sidewalls 20a of the chamber 20.

A part of the bottom plate 96 ends in front of the sidewall 20a of the chamber 20, so that a slit-shaped opening 97 (gap) is formed between an outer end 96a of the bottom plate 96 and the sidewall 20a of the chamber 20. A gas exhaust space 98 for exhausting an atmosphere of the space (processing space) within the chamber 20 is formed under the bottom plate 96. The gas exhaust space 98 is confined by the bottom plate 96, wall bodies such as the sidewall 20a and a bottom wall 20b of the chamber 20 and the vertical wall 91.

As depicted in FIG. 3, the chamber 20 has four sidewalls 20a, and the slit-shaped opening 97 is provided along each of three of the four sidewalls 20a. The three slit-shaped openings 97 are connected to the single common gas exhaust space 98. Since a carry-in/out opening 24 through which the wafer W is carried into and out of the chamber 20 and which is provided with a shutter 25 is provided at the rest one sidewall 20a, the slit-shaped opening 97 is not provided at this sidewall.

As depicted in FIG. 2, a gas exhaust opening 99 is provided at the bottom wall 20b of the chamber 20 which is in contact with the gas exhaust space 98. The gas exhaust opening 99 is connected to a gas exhaust pipe 100 (gas exhaust line). The outlet pipe 94 joins the gas exhaust pipe 100. At a downstream of the joining point, the gas exhaust pipe 100 is provided with a mist trap (a gas-liquid separation unit) 101 and a flow rate control valve 102 such as a butterfly valve or a damper. A downstream end of the gas exhaust pipe 100 is connected to a duct (not shown) of the factory gas exhaust system having the decompressed atmosphere. By controlling an opening degree of the flow rate control valve 102, the degree of decompression of the gas exhaust space 98 and the inside of the guard pocket 90 can be adjusted, so that a flow rate of a gas introduced into the gas exhaust space 98 from the space within the chamber 20 and a flow rate of the gas introduced into the guard pocket 90 from the space above the wafer W can be adjusted.

A top surface of the bottom plate 96 is gently inclined such that the height of the top surface of the bottom plate 96 is decreased as it approaches the sidewalls 20a of the chamber 20. The top surface of the bottom plate 96 is smooth and flat. As stated above, there exists no irregularity on the top surface of the bottom plate 96 except a portion where the SC2 nozzle 418 and the second DIW nozzle 419 are arranged and portions where necessary sensors and auxiliary devices are arranged. Thus, in the vicinity of the bottom plate 96, the gas is allowed to flow toward the slit-shaped openings 97 smoothly. Further, when cleaning the inside of the chamber 20 for maintenance, a cleaning liquid can be flown into the gas exhaust space 98 smoothly through the slit-shaped openings 97.

A lower end of the outer cylindrical portion 81 of the mist guard 80 placed at the high position is located slightly above an upper end of the guard pocket 90, as depicted in FIG. 5. According to experiments by the present inventors, when the mist guard 80 is located at the high position $H_G$, liquid droplets of the processing liquid hardly collide with a lower end portion of the outer cylindrical portion 81, and most of the liquid droplets collide with a relatively high portion of the mist guard 80. For this reason, even if the lower end of the outer cylindrical portion 81 is set to be lower than the upper end of the guard pocket 90, there is no merit. Preferably, by setting the lower end of the outer cylindrical portion 81 to be rather higher than the upper end of the guard pocket 90, an atmosphere (a gas, mist, etc.) within a space between the protruding portion 82 of the mist guard 80 and the protruding portion 512 of the gas exhaust cup 51 is allowed to smoothly flow into the slit-shaped openings 97 or the guard pocket 90. Thus, it is possible to achieve an advantage of suppressing an atmosphere originated from a chemical liquid or a high-humidity atmosphere (including the mist) from staying in the space above the wafer W.

Figure 8:
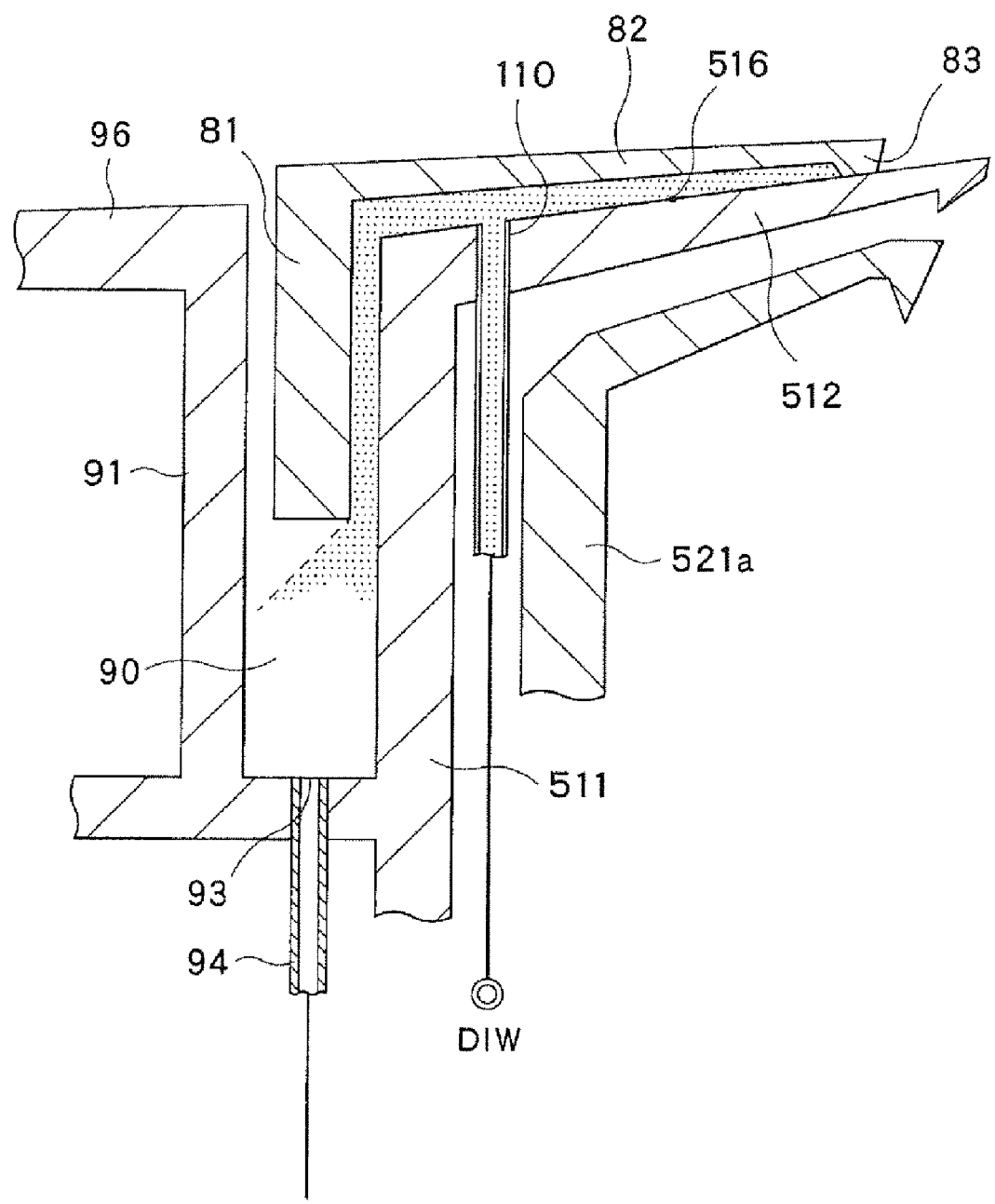
FIG. 8 is a partial longitudinal cross sectional view for describing a cleaning device for the mist guard.

As illustrated in FIG. 8, a plurality of, for example, four cleaning liquid nozzles 110 (mist guard cleaning mechanism) configured to discharge the cleaning liquid, e.g., DIW, for cleaning an inner surface of the mist guard 80 are arranged on the top surface of the protruding portion 512 of the gas exhaust cup 51 at a regular distance in a circumferential direction of the protruding portion 512. One of the four cleaning liquid nozzles 110 is shown in FIG. 8.

When the mist guard 80 is located at the low position $L_G$ which is the lowermost position, the cleaning liquid supplied from a cleaning liquid supply unit is discharged toward a bottom surface of the protruding portion 82 of the mist guard 80 from the cleaning liquid nozzles 110. Since the bottom surface of the protruding portion 82 is inclined such that the height thereof increases as it goes inwards in the radial direction of the mist guard 80, the discharged cleaning liquid moves diagonally upwards along the bottom surface of the protruding portion 82. At this time, since the protrusion 83 and the top surface of the protruding portion 512 of the gas exhaust cup 51 are in contact with each other, the cleaning liquid does not move forward over the protrusion 83. Therefore, the cleaning liquid discharged from the cleaning liquid nozzles 110 fills the space between the mutually facing surfaces of the gas exhaust cup 51 and the mist guard 80. If the discharge of the cleaning liquid from the cleaning liquid nozzles 110 is stopped, the cleaning liquid flows down toward the guard pocket 90 as the top surface 516 of the protruding portion 512 is inclined such that the height thereof increases as it goes inwards in the radial direction.

The mutually facing surfaces of the gas exhaust cup 51 and the mist guard 80 are cleaned by the flow of the cleaning liquid. The cleaning liquid is drained out from the guard pocket 90 through the outlet pipe 94 and introduced into the mist trap 101 to be sent out into a factory waste liquid system through a drain pipe connected to the mist trap 101.

Besides the aforementioned cleaning liquid nozzles 110, cleaning liquid nozzles for cleaning the inside of the cup 50 and nearby components may be additionally provided. However, in the present specification, explanation thereof may not be provided.

Now, an example of an operation sequence of the processing unit 16 will be explained. The following operation sequence is automatically performed based on the process recipes and the control programs stored in the storage unit 19 of the control device 4 (control unit) under the control of the control device 4.

First, the arm of the substrate transfer device 17 carries the wafer W into the chamber 20 (processing vessel) through the carry-in/out opening 24, and the wafer W is held by the holding unit 31 of the substrate holding mechanism 30. After the arm of the substrate transfer device 17 is retreated out of the chamber, the shutter 25 is closed. When the wafer W is carried in, the mist guard 80 is located at the low position. Below, a series of processes is performed on the wafer W. Here, the description will be provided for an example case where a DHF cleaning process, a DIW rinsing process, a SC1 cleaning process, a DIW rinsing process, an IPA replacing process, and a drying process are performed on the wafer W in sequence.

[DHF Cleaning Process]

First, the second nozzle arm 422 is rotated (see an arrow M2 of FIG. 3), and the DHF nozzle 413, the first DIW nozzle 414 and the IPA nozzle 415 are placed directly above the central portion of the wafer W (see FIG. 9A) beyond the space above the mist guard 80 which is located at the low position $L_G$ (see FIG. 4C). Then, the mist guard 80 is raised to be placed at the high position $H_G$ (see FIG. 4A and FIG. 5). Subsequently, the wafer W is begun to be rotated. The rotation of the wafer W is continued until the series of processes upon the wafer W are ended. The DHF is supplied onto the central portion of the wafer W being rotated from the DHF nozzle 413. The DHF flows on the surface of the wafer W toward an edge of the wafer W by a centrifugal force, and the entire surface of the wafer W is covered with a liquid film of the DHF, so that the surface of the wafer W is processed by the DHF.

Most of the processing liquid (here, the DHF) scattered from the wafer W is flown diagonally downwards after passing through the space between the first and second rotating cups 53 and 54. Thereafter, the processing liquid is introduced into any one (an inlet of which is opened) of liquid passages 525a, 525b and 525c depending on the positions of the first and second movable cup members 522 and 523 which are predetermined based on the kind (acid, alkaline and organic) of the processing liquid. Then, the processing liquid is introduced into any one of the liquid storage portions 522a, 522b and 522c to be wasted into the factory waste liquid system via the corresponding one of the liquid drain lines 523a, 523b and 523c. Since these flows of the processing liquids are same in all processes where the processing liquids are supplied onto the surface of the wafer W, redundant description in the subsequent processes will be omitted.

A part of the processing liquid scattered from the wafer W tends to flow toward the sidewalls 20a of the chamber 20 beyond the space above the protruding portion 512 of the gas exhaust cup 51. Most of these liquid droplets of the processing liquid collide with the inner surface of the mist guard 80 located at the high position to be collected. Thus, adhesion of the liquid droplets of the processing liquid to the sidewalls 20a of the chamber 20 is suppressed or minimized. The liquid collected by the mist guard 80 adheres to the inner surface of the mist guard 80 or flows downwards on the inner surface of the mist guard 80 by gravity.

At the latest, when the supply of the first processing liquid (here, the DHF) onto the wafer W is begun (typically, all the time when the substrate processing system 1 is in a typical operation mode), clean air starts to be blown downwards from the FFU 21 toward the internal space of the chamber 20, that is, the processing space. This flow of the clean air is rectified by the rectifying plate 22 and heads toward the wafer W.

At the latest, when the supply of the first processing liquid onto the wafer W is begun, the inside of the gas exhaust passage 551 is being exhausted through the gas exhaust duct 553, so that the atmosphere in the space above and in the vicinity of the wafer W is sucked in through a gap between a tip end of the protruding portion 512 of the gas exhaust cup 51 and a tip end of the protruding portion 521b of the liquid drain cup 52 (as indicated by solid-line arrows of FIG. 5). A gas exhaust rate through the gas exhaust duct 553 is maintained constant until the wafer W is carried out of the chamber 20 after being carried into the chamber 20. Accordingly, while the clean air supplied from the FFU 21 is supplied into the space above the wafer W, the atmosphere in the space above the wafer W is introduced into the gas exhaust passage 551. Accordingly, the atmosphere in the space above and in the vicinity of the wafer W is maintained clean.

In the present exemplary embodiment, the liquid passages 525a, 525b and 525c are not evacuated (suctioned). That is, the gas introduced into the cup 50 from the space above and in the vicinity of the wafer W is not introduced into the liquid passages 525a, 525b and 525c but is all introduced into the gas exhaust passage 551. Since it is difficult to set the liquid passages 525a, 525b and 525c to have the same cross sectional shape, the liquid passages 525a, 525b and 525c have different flow path resistances. Due to this difference in the flow path resistances, in case of suctioning the liquid passages 525a, 525b and 525c, the flow rate of the gas introduced into the cup 50 from the space above and in the vicinity of the wafer W may be differed depending on the liquid passage which is opened. In the present exemplary embodiment, however, such a problem does not occur, and the flow of the gas in the space above and the in the vicinity of the wafer W is maintained constant regardless of the kind of the processing liquid being used in the processing, which contributes to improvement of uniformity of the processing.

At the latest, when the supply of the first processing liquid onto the wafer W is begun, the inside of the guard pocket 90 and the gas exhaust space 98 are suctioned (evacuated) through the outlet pipe 94 and the gas exhaust pipe 100. This evacuation is continued until the wafer W is carried out of the chamber 20 after being carried into the chamber 20. By this evacuation, atmospheres (a gas, mist, etc.) which exist in the space between the sidewalls 20a of the chamber 20 and the mist guard 80 above the bottom plate 96 and in the space between the protruding portion 82 of the mist guard 80 and the protruding portion 512 of the gas exhaust cup 51 are sucked into the guard pocket 90 or sucked into the gas exhaust space 98 through the slit-shaped openings 97 (see solid-line arrows of FIG. 5 and FIG. 6). Accordingly, the atmosphere which is contaminated or has the high humidity can be suppressed from staying in the aforementioned spaces.

The liquid droplets which flow downwards on the inner surface of the mist guard 80 by the gravity fall into the guard pocket 90 and is drained out into the non-illustrated factory waste liquid system from a drain 103 of the mist trap 101 after passing through the outlet pipe 94 and the gas exhaust pipe 100.

[(First) DIW Rinsing Process]

Upon the completion of the DHF cleaning process, while maintaining the mist guard 80 at the high position $H_G$, a discharge of the DIW from the first DIW nozzle 414 is begun, and, immediately thereafter, the discharge of the DHF from the DHF nozzle 413 is stopped. The DHF and a reaction product remaining on the wafer W are washed away by this DIW.

[SC1 Cleaning Process]

Figure 9A:
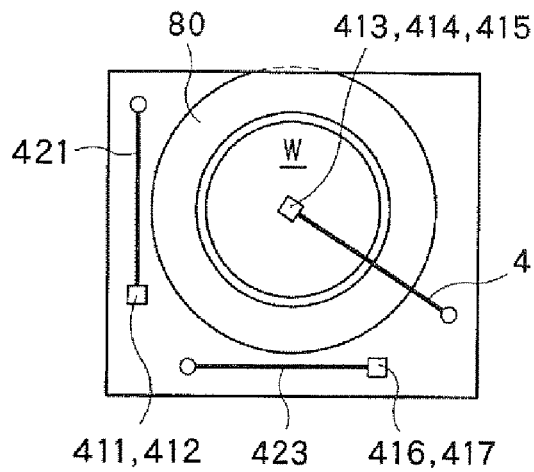
FIG. 9A to FIG. 9F are plan views for describing a movement of the nozzle arm.
Figure 9D:
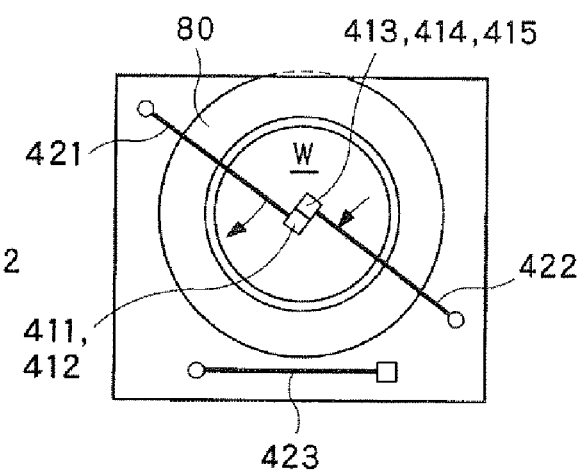
Figure 9B:
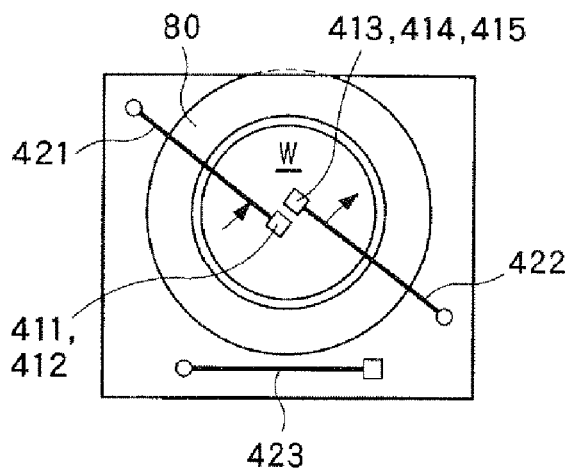
Figure 9E:
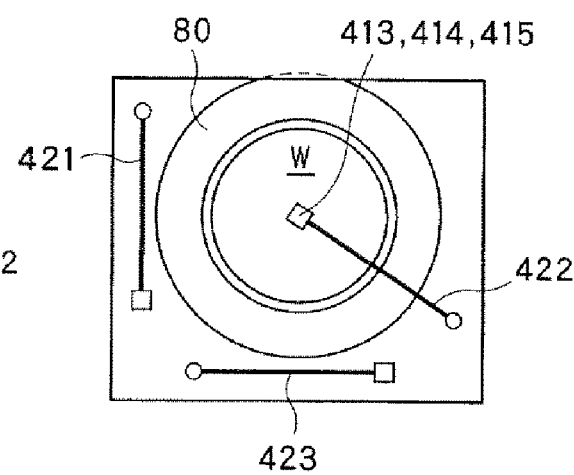
Figure 9C:
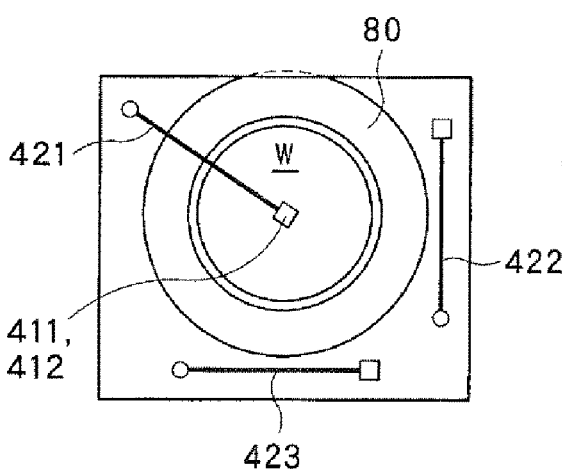

In the transition from the DIW rinsing process to the SC1 cleaning process, switchover of the nozzle arm (nozzle switching operation) is first performed (see FIG. 9A to FIG. 9C). While continuously discharging the DIW from the first DIW nozzle 414 (a discharge rate of the DIW may be decreased within a range in which the liquid film of the DIW on the surface of the wafer W is not cut), the mist guard 80 is lowered and placed at the intermediate position $M_G$, and the nozzle arms 421 and 422 are raised and placed at the high position $H_N$ (see FIG. 4B). Thereafter, the first nozzle arm 421 is rotated, and the AS nozzle 412 is placed directly above the central portion of the wafer W. At this time, to suppress the collision between the nozzles at the tip end portion of the first nozzle arm 421 and the nozzles at the tip end portion of the second nozzle arm 422, immediately before the SC1 nozzle 411 reaches the position directly above the central portion of the wafer W, a retreating rotation of the second nozzle arm 422, that is, the movement of the second nozzle arm 422 toward the home position thereof is begun while continuously discharging the DIW from the first DIW nozzle 414 of the second nozzle arm 422 (see FIG. 9B). Further, at a time point immediately before the AS nozzle 412 reaches the position directly above the central portion of the wafer W, a discharge of the DIW from the AS nozzle 412 is begun. At this time, without using the dual fluid generating function of the AS nozzle 412 (that is, without supplying a nitrogen gas to the AS nozzle 412), the DIW, which is not turned into the mist, is discharged from the AS nozzle 412. After the supply of the DIW onto the central portion of the wafer W from the AS nozzle 412 is begun, the discharge of the DIW from the first DIW nozzle 414 is stopped. If the AS nozzle 412 is located directly above the central portion of the wafer W and the first DIW nozzle 414 is returned back to the home position thereof (see FIG. 9C), the mist guard 80 is raised to be placed at the high position $H_G$, and the second nozzle arm 422 is located at the low position $L_N$ (see FIG. 4A).

As stated above, by overlapping a period during which the DIW is supplied to the vicinity of the central portion of the wafer W from the AS nozzle 412 and a period during which the DIW is supplied to the vicinity of the central portion of the wafer W from the first DIW nozzle 414, exposure of a part of the surface of the wafer W to the atmospheric atmosphere, which is caused by a partial loss of the liquid film of the DIW from the surface of the wafer W (which may generate a water mark and particle), can be suppressed. As long as this effect can be achieved, a discharge start timing of the DIW from the AS nozzle 412 and a discharge stop timing of the DIW from the first DIW nozzle 414 may be set arbitrarily.

Further, while the mist guard 80 is located at the intermediate position $M_G$, the function of blocking the scattering of the liquid droplets by the mist guard 80 is deteriorated, as compared to the case where the mist guard 80 is located at the high position $H_G$. For this reason, to reduce a scattering amount of the liquid droplets from the wafer W, a height of the scattering, and so forth, it is desirable to prepare measures such as reducing a rotation speed of the wafer W, decreasing the discharge rates of the DIW from the AS nozzle 412 and the first DIW nozzle 414 (within a range where the surface of the wafer W is not exposed), and/or minimizing a time period during which the AS nozzle 412 and the first DIW nozzle 414 discharge the DIW at the same time (because a splash may easily occur if the liquids discharged from the individual nozzles collide with each other on the wafer W).

Subsequently, the supply of the SC1 onto the central portion of the wafer W from the SC1 nozzle 411 is begun, and, immediately thereafter, the discharge of the DIW from the AS nozzle 412 is stopped. By supplying the SC1 onto the wafer W for a predetermined time period, SC1 cleaning is performed on the wafer W. At this time as well, liquid droplets of this processing liquid scattered from the wafer W are collected by the mist guard 80. Since a gas exhaust operation while the SC1 cleaning process is performed is the same as that while the DHF cleaning process is performed, redundant description thereof will be omitted here.

[(Second) DIW Rinsing Process]

Upon the completion of the SC1 cleaning process, while maintaining the mist guard 80 at the high position $H_G$, the discharge of the DIW from the AS nozzle 412 is begun, and, immediately thereafter, the discharge of the SC1 from the SC1 nozzle 411 is stopped. The SC1 and a reaction product remaining on the wafer W are washed away by the DIW.

[IPA Replacing Process]

In the transition from the (second) DIW rinsing process to the IPA replacing process, switchover of the nozzle arm is first performed. While continuously discharging the DIW from the AS nozzle 412 (the discharge rate of the DIW may be decreased within a range in which the liquid film of the DIW on the surface of the wafer W is not cut), the mist guard 80 is lowered to be placed at the intermediate position $M_G$, and the nozzle arms 421 and 422 are raised to be placed at the high position $H_N$ (see FIG. 4B). Thereafter, the second nozzle arm 422 is rotated, and the first DIW nozzle 414 is placed directly above the central portion of the wafer W. At this time, to suppress the collision between the nozzle provided at the tip end portion of the first nozzle arm 421 and the nozzle provided at the tip end portion of the second nozzle arm 422, immediately before the first DIW nozzle 414 reaches the position directly above the central portion of the wafer W, a retreating rotation of the first nozzle arm 421, that is, a movement of the first nozzle arm 421 toward the home position thereof is begun while continuing the discharge of the DIW from the AS nozzle 412 of the first nozzle arm 421 (see FIG. 9D). Further, at a time point immediately before the first DIW nozzle 414 reaches the position directly above the central portion of the wafer W, the discharge of the DIW from the first DIW nozzle 414 is begun. Furthermore, after the supply of the DIW from the first DIW nozzle 414 onto the central portion of the wafer W is begun, the discharge of the DIW from the AS nozzle 412 is stopped.

Thereafter, a discharge of the IPW from the IPA nozzle 415 is begun in the state shown in FIG. 9D, and, immediately afterward, the discharge of the DIW from the first DIW nozzle 414 is stopped. Concurrently with or slightly after the beginning of the discharge of the IPA, the mist guard 80 is lowered to be placed at the low position $L_G$. The DIW on the surface of the wafer W is replaced with the supplied IPA, and the surface of the wafer W is covered with a liquid film of the IPA.

[Drying Process]

Figure 9F:
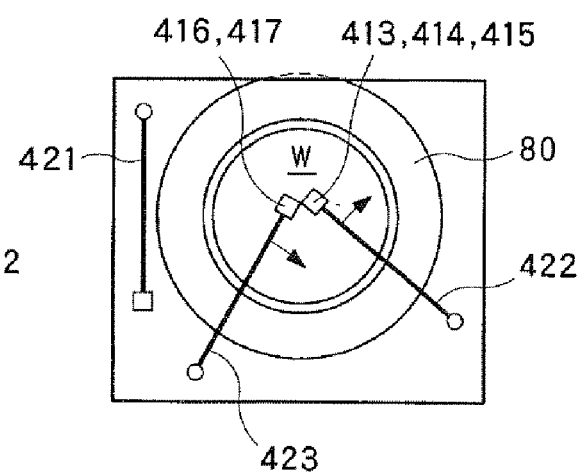

After the first nozzle arm 421 returns to the home position thereof, the third nozzle arm 423 is rotated, and the first nitrogen gas nozzle 416 is placed directly above the central portion of the wafer W. If the first nitrogen gas nozzle 416 approaches the position directly above the central portion of the wafer W, the second nozzle arm 422 is begun to be moved toward the home position thereof (toward an edge portion of the wafer W), while continuing the discharge of the IPA from the IPA nozzle 415. When the first nitrogen gas nozzle 416 is placed directly above the central portion of the wafer W, a discharge of the nitrogen gas from the first nitrogen gas nozzle 416 is started. Subsequently, a discharge of the nitrogen gas from the second nitrogen gas nozzle 417 is begun, and the third nozzle arm 423 is begun to be moved toward the home position thereof (toward the edge portion of the wafer W) (see FIG. 9F).

The rotating motions of the second nozzle arm 422 and the third nozzle arm 423 are controlled such that a position of collision of the IPA discharged from the IPA nozzle 415 onto the surface of the wafer W is located at an outer side than a position of collision of the nitrogen gas discharged from the second nitrogen gas nozzle 417 onto the surface of the wafer W in a radial direction of the wafer W. Accordingly, the nitrogen gas discharged from the second nitrogen gas nozzle 417 pushes the liquid film of the IPA toward the peripheral portion of the wafer W, so that a circular drying region formed on the surface of the wafer W is spread from the central portion of the wafer W toward the edge portion thereof. At a time point when the second nitrogen gas nozzle 417 passes the edge of the wafer W after the IPA nozzle 415 passes the edge of the wafer W, the entire surface of the wafer W is dried. Then, the drying process is ended. The nozzle arms 422 and 423 are returned back to the home positions thereof and stand by there.

In this drying process, the mist guard 80 is located at the low position $L_G$. Therefore, the flow of the gas heading toward the slit-shaped openings 97 from the space above the wafer W is not hampered by the mist guard 80. Accordingly, vapor or mist of the DIW scattered in the previous process can be suppressed from staying in the space above the wafer W, or an amount thereof can be reduced. Therefore, the space above the wafer W can be maintained at a low humidity, so that drying efficiency can be improved. Furthermore, even if the IPA is scattered and adheres to the sidewalls 20a of the chamber 20, no adverse effect might be caused on the atmosphere within the chamber 20 because the IPA having high volatility is evaporated in a short period of time to be exhausted to the outside of the chamber 20.

Further, while the drying process is being performed, the cleaning process is performed on the mist guard 80 located at the low position $L_G$ according to the sequence described with reference to FIG. 8. Thus, a chemical liquid component adhering to the surface (surface at a wafer W side) of the mist guard 80 is removed.

After the drying process is finished, the processed wafer W is carried out of the chamber 20 in the reverse sequence to that in which the wafer W is carried into the chamber 20.

Further, though not included in the above-described operation sequence, a process of performing SC2 cleaning by supplying the SC2 liquid onto the central portion of the wafer W from the SC2 nozzle 418 and then performing a ringing processing by supplying the DIW onto the central portion of the wafer W from the second DIW nozzle 419 in the state that the mist guard 80 is placed at the high position $H_G$ as described in FIG. 7 may be included in the operation sequence.

According to the above-described exemplary embodiment, by providing the vertically movable mist guard 80, scattered chemical liquid components or moisture can be blocked by the raised mist guard 80, so that the chemical liquid components or moisture can be efficiently suppressed from adhering to the inner wall surface of the chamber 20 or the components within the chamber. Furthermore, since the mist guard 80 has the protruding portion 82, the aforementioned blocking effect can be further improved. In addition, by lowering the mist guard 80, the exhaust of the atmosphere in the space above the wafer W during the drying processing, for example, may not be impeded by the mist guard 80, so that drying efficiency can be improved.

Figure 10:
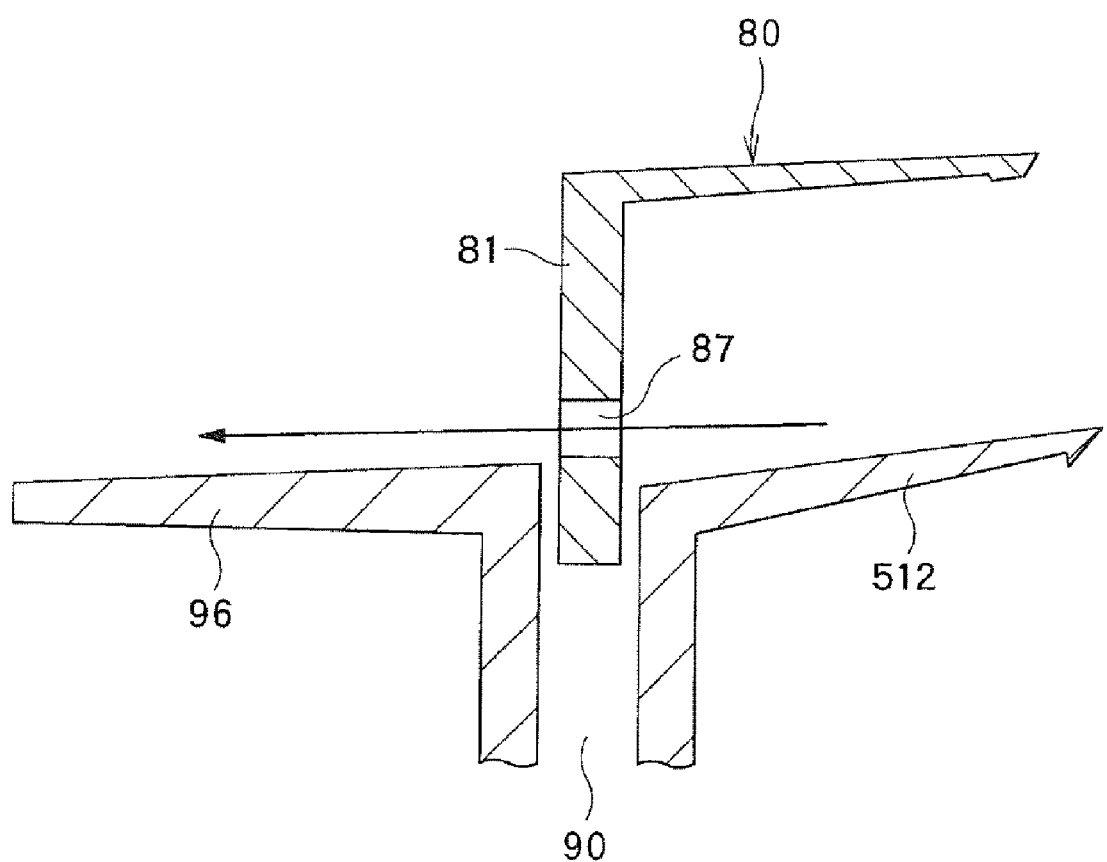
FIG. 10 is a schematic longitudinal cross sectional view for describing a gas passage opening provided at the mist guard.

In the above-described exemplary embodiment, though the lower end of the outer cylindrical portion 81 of the mist guard 80 placed at the high position $H_G$ is located outside the guard pocket 90, the lower end of the outer cylindrical portion 81 may be located inside the guard pocket 90. In such a case, as shown in FIG. 10, a gas passage opening 87 may be provided at the lower end portion of the outer cylindrical portion 81. Desirably, multiple gas passage openings 87 extended along a circumferential direction of the mist guard 80 are arranged at a regular distance along the circumferential direction of the mist guard 80. By providing the gas passage openings 87, the gas can be allowed to flow from a space of the mist guard 80 at a wafer side to the sidewalls 20*a* of the chamber 20, so that the gas can be introduced into the slit-shaped openings 97.

In the above-described exemplary embodiment, though the gas exhaust cup 51 is the outermost stationary cup-shaped constituent component of the cup 50, the exemplary embodiment is not limited thereto. The gas exhaust cup 51 may be removed from the cup 50, and the liquid drain cup 52 may be configured as the outermost stationary cup-shaped constituent component of the cup 50. In this case, the mist guard 80 is provided adjacent to an outer side of the liquid drain cup 52. In this case, a positional relationship between the liquid drain cup 52 and the mist guard 80 may be understood by regarding the gas exhaust cup 51 as the liquid drain cup 52 in FIG. 4A to FIG. 4C. Furthermore, in this case, pipes constituting the liquid drain lines 523*a*, 523*b* and 523*c* are connected to the factory gas exhaust system (or a suctioning device such as a suction pump or an ejector) and have a function as the gas exhaust line. In this case, a gas-liquid separation device such as a mist trap may be provided at the gas exhaust line, and the liquid separated in the mist trap may be wasted into, for example, the factory waste liquid system.

Figure 11:
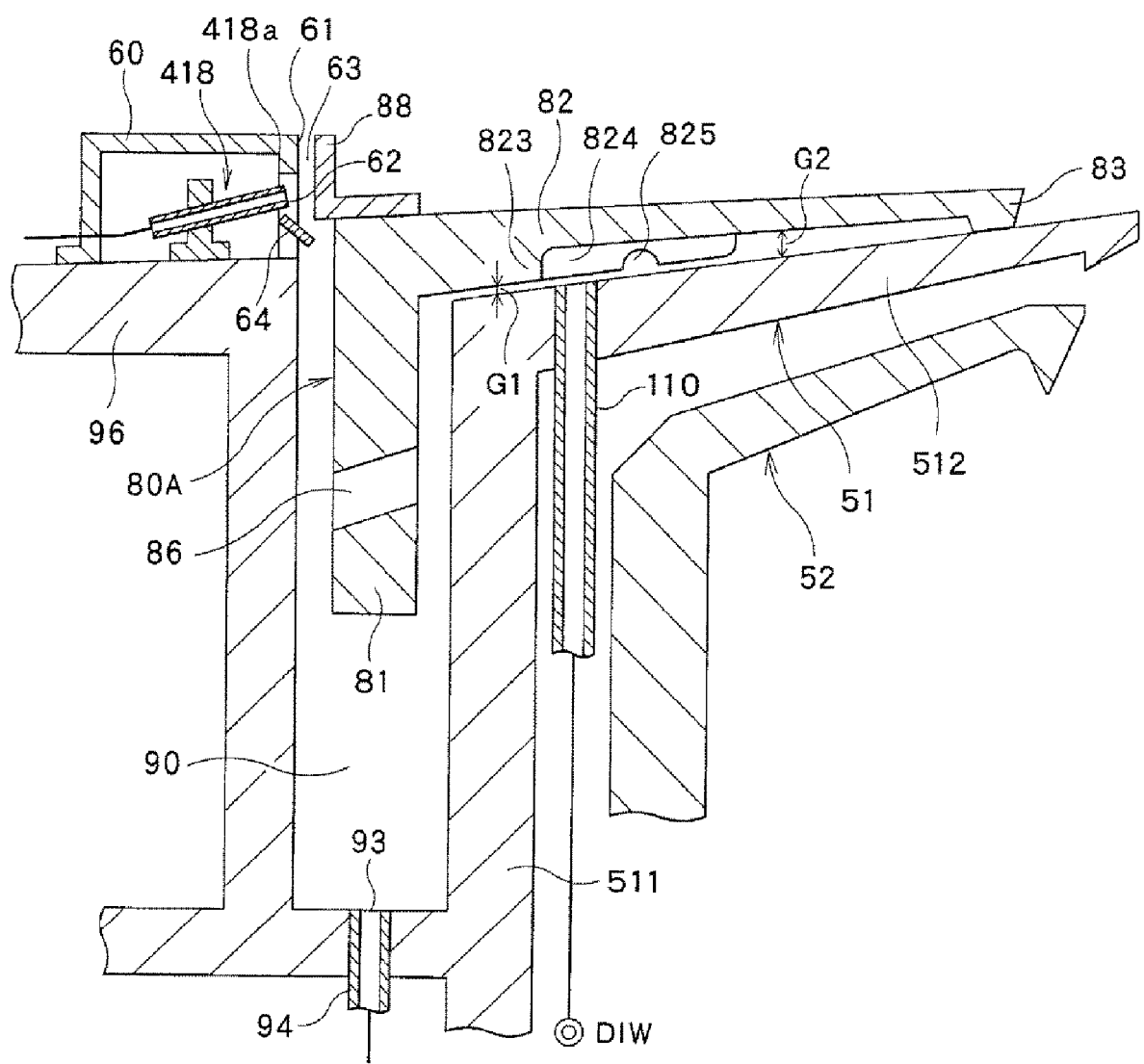
FIG. 11 is a schematic longitudinal cross sectional view illustrating the exemplary embodiment in which a fixed nozzle cover and a modification example of the mist guard are provided.

Referring to FIG. 11, another exemplary embodiment regarding the cleaning processing of the mist guard 80 will be discussed. In FIG. 11, the same components as already described with reference to FIG. 1 to FIG. 10 will be assigned same reference numerals, and redundant description thereof will be omitted.

As depicted in FIG. 11, a mist guard 80A is different from the mist guard 80 shown in FIG. 8 in that a gap forming portion 823 (a portion protruding downwards) of a ring shape (annular shape) is provided at the bottom surface of the protruding portion 82. The gap forming portion 823 is extended from the inner peripheral surface of the outer cylindrical portion 81 of the mist guard 80A inwardly in the radial direction. By providing the gap forming portion 823, a gap G1 between a bottom surface of the gap forming portion 823 and the top surface of the protruding portion 512 of the gas exhaust cup 51, which faces the bottom surface, is narrower than a gap G2 between a portion (an inner side than the gap G1 in the radial direction) of the mist guard 80A where the gap forming portion 823 is not provided and the top surface of the protruding portion 512 of the gas exhaust cup 51 which faces that portion.

Desirably, the size of the gap G1 is set to be large enough for a cleaning liquid to be described later to be diffused in the entire region of the gap G1 and to be small enough for the cleaning liquid not to be easily flown out of the gap G1. By way of non-limiting example, the gap G1 is set to be 0.1 mm to 0.5 mm.

The gap forming portion 823 is continuously extended along the entire circumference of the protruding portion 82 of the mist guard 80A. Provided at the bottom surface of the gap forming portion 823 is a plurality of diametrical grooves 824 for guiding the cleaning liquid supplied from the cleaning liquid nozzles 110 into the gap G2. A gap between a groove bottom surface (upper end surface of the groove) of each diametrical groove 824 and the top surface of the protruding portion 512 of the gas exhaust cup 51 facing the diametrical groove 824 is larger than the gap G1. The diametrical groove 824 is extended inwards in the radial direction and communicates with the gap G2. The number of the diametrical grooves 824 is the same as the number of the cleaning liquid nozzles 110. The cleaning liquid nozzles 110 are provided at the protruding portion 512 to be located at positions facing the diametrical grooves 824, and supply the cleaning liquid toward the diametrical grooves 824. The diametrical grooves 824 need not be extended in the precisely diametrical direction but may be extended at a certain angle with respect to the diametrical direction.

A circumferential groove (a groove in the circumferential direction) 825 is formed at the bottom surface of the gap forming portion 823 of the ring shape, and this circumferential groove 825 is extended along the entire circumference of the mist guard 80A. This circumferential groove 825 intersects with and communicates with all of the diametrical grooves 824. The position of the circumferential groove 825 in the radial direction is located at an inner side than the cleaning liquid nozzles 110 in the radial direction.

Effects of providing the gap forming portion 823, the diametrical grooves 824 and the circumferential groove 825 will be described below.

The mist guard 80A is placed at the low position $L_G$, as shown in FIG. 11, and the DIW as the cleaning liquid is discharged from the cleaning liquid nozzles 110. The cleaning liquid discharged from the respective cleaning liquid nozzles 110 is introduced into the gap G2 through the corresponding diametrical grooves 824.

At this time, a flow rate of the cleaning liquid discharged from the cleaning liquid nozzles 110 is set to be higher than a flow rate of the cleaning liquid flown into the guard pocket 90 through the gap G1. Thus, the entire region of the gap G2 in the circumferential direction can be filled with the cleaning liquid. At this time, since the bottom surface of the protrusion 83 provided at the inner circumferential end of the protruding portion 82 of the mist guard 80A is in contact with the top surface of the protruding portion 512 of the gas exhaust cup 51, the cleaning liquid hardly leaks from between the bottom surface of the protrusion 83 and the top surface of the protruding portion 512. Thus, the entire region of the gap G2 in the circumferential direction can be filled with the cleaning liquid.

The bottom surface of the protrusion 83 may not be in contact with the top surface of the protruding portion 512. In this case, the flow rate of the cleaning liquid discharged from the cleaning liquid nozzles 110 needs to be set to be larger than a sum of the flow rate of the cleaning liquid flown into the guard pocket 90 through the gap G1 and a flow rate of the cleaning liquid flown from a gap between the protrusion 83 and the top surface of the protruding portion 512.

The cleaning liquid flowing within the diametrical grooves 824 is also introduced into the circumferential groove 825 to be diffused in the circumferential direction. If the gap G2, the diametrical grooves 824 and the circumferential groove 825 are filled with the cleaning liquid, diffusion of the cleaning liquid into the narrow gap G1 also progresses. The entire region of the space (that is, gap G1+gap G2) between the bottom surface of the protruding portion 82 of the mist guard 80A and the top surface of the protruding portion 512 of the gas exhaust cup 51 is filled with the cleaning liquid. A deposit such as a chemical liquid and a reaction product adhering to the bottom surface of the protruding portion 82 and the top surface of the protruding portion 512 is dissolved in this cleaning liquid. The deposit dissolved in the cleaning liquid is flown into the guard pocket 90 along with the cleaning liquid. Accordingly, the surface (surface at the wafer W side) of the mist guard 80A can be cleaned.

Thereafter, if the mist guard 80A is raised, the cleaning liquid in the space between the bottom surface of the protruding portion 82 of the mist guard 80A and the top surface of the protruding portion 512 of the gas exhaust cup 51 is flown into the guard pocket 90 along the top surface of the protruding portion 512 which is an inclined surface. Then, the cleaning processing is ended. The above-described cleaning operation may be repeated.

In the above-described configuration according to the exemplary embodiment shown in FIG. 11, the space between the bottom surface of the protruding portion 82 of the mist guard 80A and the top surface of the protruding portion 512 of the gas exhaust cup 51 can be entirely filled with the cleaning liquid. Thus, the entire region of the cleaning target surface including the bottom surface of the protruding portion 82 and the top surface of the protruding portion 512 can be cleaned uniformly.

Figure 12:
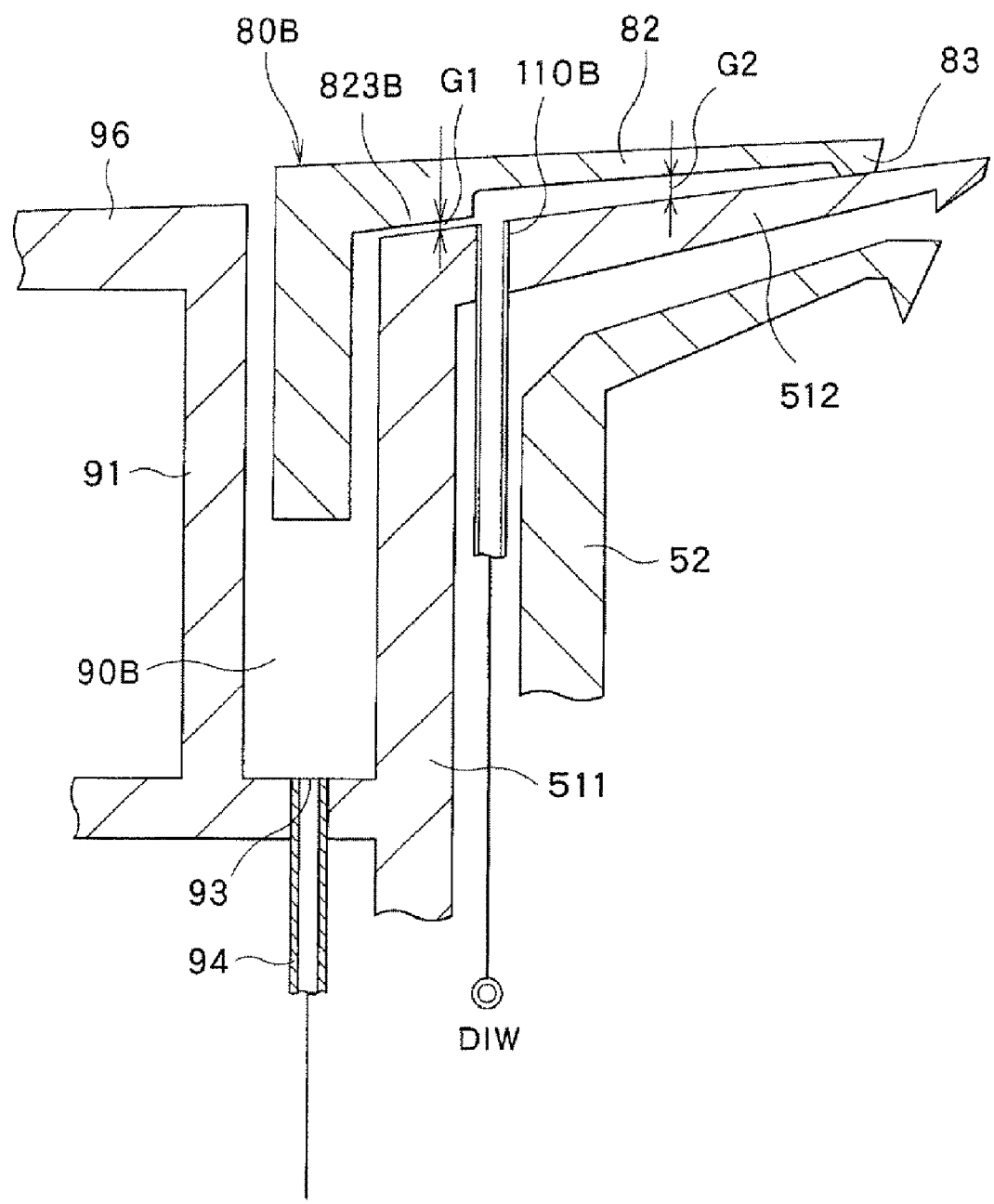
FIG. 12 is a schematic longitudinal cross sectional view illustrating the exemplary embodiment in which another modification example of the mist guard is provided.

In the above-described exemplary embodiment, though the diametrical grooves 824 are provided at the gap forming portion 823, these diametrical grooves 824 may not be provided. In such a case, as depicted in FIG. 12, cleaning liquid nozzles 110B may be provided at the protruding portion 512 of the gas exhaust cup 51 at an inner side in the radial direction than a gap forming portion 823B of the mist guard 80B. The gap G2 can be filled with the cleaning liquid supplied from the cleaning liquid nozzles 110B along the entire circumference of the gap G2. Further, the gap G1 between the bottom surface of the gap forming portion 823B and the top surface of the protruding portion 512 may also be filled with the cleaning liquid along the entire circumference thereof. A deposit dissolved in the cleaning liquid is flown into a guard pocket 90B along with the cleaning liquid. Accordingly, the surface (surface at the wafer W side) of the mist guard 80B can be cleaned.

A cover 60 is provided in the vicinity of the SC2 nozzle 418, that is, the stationary nozzle, as shown in FIG. 11. The cover 60 is fixed to the bottom plate 96. An opening 62 is formed at a front surface 61 of the cover 60 facing the mist guard 80A. Through the opening 62, the SC2 liquid (processing liquid) can be discharged toward the wafer W from the SC2 nozzle 418 which is covered by the cover 60.

A shield member 88 is provided at an uppermost portion of the outer cylindrical portion of the mist guard 80A, that is, an outermost portion of the top surface of the protruding portion 82. The shield member 88 may be formed as a single body with the mist guard 80A, and may be fixed to the mist guard 80A after being fabricated separately from the mist guard 80A. When the mist guard 80A is located at the low position $L_G$, the shield member 88 faces a portion of the front surface 61 of the cover 60 where the opening 62 is not formed, with a narrow gap 63 (e.g., ranging from 1 mm to 2 mm) therebetween.

It may be difficult for a gas to flow in the narrow gap 63. Thus, vapor of the SC2 liquid (processing liquid) staying in the vicinity of the discharge opening of the SC2 nozzle 418 can be suppressed from being diffused into the chamber 20 while the discharge of the SC2 liquid from the SC2 nozzle 418 is stopped, and, also, the vapor of the SC2 liquid (processing liquid) can be suppressed from being diffused into the chamber 20 while a dummy dispense is performed from the SC2 nozzle 418 (a discharge rate at the time when performing the dummy dispense is very small as the SC2 nozzle is stationary).

The cover 60 and the shield member 88 may be configured as a single body. In this case, the cover 60 and the shield member 88 are moved up and down along with the mist guard 80A. Further, in this case, the gap 63, which is provided to suppress interference between the cover 60 and the shield member 88 when the mist guard 80A is moved up and down, may not be necessary. Thus, it is possible to more securely suppress the diffusion of the vapor of the SC2 liquid (processing liquid) into the chamber 20.

A gutter 64 (liquid guiding member) is provided under the discharge opening of the SC2 nozzle 418. The SC2 liquid dripped down from the discharge opening of the SC2 nozzle 418 is flown into the guard pocket 90 through the gutter 64. Accordingly, contamination of the bottom plate 96 with the SC2 liquid dripped down from the SC2 nozzle 418 and evaporation of the SC2 dripped down onto the bottom plate 96 and diffusion of the evaporated SC2 into the chamber 20 can be suppressed.

In the above-described exemplary embodiments, the processing target substrate is the semiconductor wafer. However, the exemplary embodiments are not limited thereto. By way of non-limiting example, another kind of substrate such as a glass substrate for a liquid crystal display or a ceramic substrate may be used.

We claim:

1. A substrate processing apparatus, comprising:
a substrate holding unit configured to hold a substrate;
at least one processing liquid nozzle configured to discharge a processing liquid onto the substrate held by the substrate holding unit;
a processing vessel configured to accommodate therein the substrate holding unit and the at least one processing liquid nozzle;
a stationary cup body disposed around the substrate holding unit and configured to receive at least the processing liquid or mist of the processing liquid discharged onto the substrate, the stationary cup body not being moved relatively with respect to the processing vessel;
a mist guard provided at an outside of the stationary cup body to surround the stationary cup body and configured to block a liquid scattered outwards beyond a space above the stationary cup body;

a guard elevating mechanism configured to elevate the mist guard to a first guard height and a second guard height lower than the first guard height; and a control unit configured to control the guard elevating mechanism to elevate the mist guard to the first guard height when supplying the processing liquid from the at least one processing liquid nozzle onto the substrate held by the substrate holding unit, and to elevate the mist guard to the second guard height when drying the substrate, wherein the mist guard comprises a cylindrical portion of a cylindrical shape and a protruding portion protruded above the stationary cup body from an upper portion of the cylindrical portion toward an inside of the cylindrical portion, and an air flow is to be formed between the mist guard and the stationary cup body when the mist guard is at the first guard height, and an air flow is to be formed above the mist guard when the mist guard is at the second guard height, wherein the substrate processing apparatus further comprises a stationary nozzle configured to discharge a processing liquid from an outside of the mist guard onto the substrate held by the substrate holding unit, and the mist guard is provided with a liquid passage opening through which the processing liquid discharged from the stationary nozzle is allowed to reach the substrate after passing through the mist guard when the mist guard is at the first guard height.

2. The substrate processing apparatus of claim 1, further comprising:

a bottom plate provided outside of the mist guard and configured to partition a bottom of a processing space within the processing vessel; and a gas exhaust opening which is provided outside of the mist guard and through which an atmosphere within the processing space is exhausted to an outside of the processing space.

3. The substrate processing apparatus of claim 2, wherein the bottom plate is extended to a sidewall of the processing vessel, and a top surface of the bottom plate is inclined such that a height thereof decreases as approaching the sidewall.

4. The substrate processing apparatus of claim 2, wherein, when the mist guard is at the first guard height, a lower end of the cylindrical portion of the mist guard is at a position higher than a top surface of the bottom plate.

5. The substrate processing apparatus of claim 1, wherein the at least one processing liquid nozzle includes a first processing liquid nozzle and a second processing liquid nozzle, the substrate processing apparatus further comprises a first nozzle arm configured to move the first processing liquid nozzle while holding the first processing liquid nozzle; and a second nozzle arm configured to move the second processing liquid nozzle while holding the second processing liquid nozzle, and the control unit controls the mist guard to be elevated to a third guard height between the first guard height and the second guard height when performing a nozzle switching operation of driving the second nozzle arm to advance the second processing liquid nozzle from a position outside the substrate held by the substrate holding unit to a position above the substrate and driving the first nozzle arm to retreat the first processing liquid nozzle from the position above the substrate to a position outside the substrate.

6. The substrate processing apparatus of claim 5, further comprising:

a first arm elevating mechanism configured to elevate the first nozzle arm to between a first arm height and a second arm height lower than the first arm height; and a second arm elevating mechanism configured to elevate the second nozzle arm to between a third arm height and a fourth arm height lower than the third arm height, wherein the control unit controls the first arm elevating mechanism to elevate the first nozzle arm to the first arm height and controls the second arm elevating mechanism to elevate the second nozzle arm to the third arm height when performing the nozzle switching operation.

7. The substrate processing apparatus of claim 5, further comprising:

a rotating mechanism configured to rotate the substrate held by the substrate holding unit, wherein the control unit controls the rotating mechanism to set a rotation speed of the substrate at a time when the nozzle switching operation is performed to be smaller than a rotation speed of the substrate at a time when the first processing liquid nozzle discharges the processing liquid onto the substrate before performing the nozzle switching operation.

8. The substrate processing apparatus of claim 1, further comprising:

a mist guard accommodating portion configured to accommodate the cylindrical portion of the mist guard therein; and an outlet unit configured to drain a liquid or a gas flown into the mist guard accommodating portion.

9. The substrate processing apparatus of claim 1, further comprising:

a cleaning mechanism configured to clean a surface of the mist guard facing the stationary cup body.

10. The substrate processing apparatus of claim 1, wherein the stationary cup body has an inclined top surface extended toward a central portion of the substrate held by the substrate holding unit, the inclined top surface is disposed such that a height thereof increases as approaching the central portion of the substrate, the inclined top surface is in contact with a tip end portion of the protruding portion of the mist guard at the second guard height, to thereby allow a space in contact with a surface of the mist guard facing the stationary cup body to be isolated from a space above the substrate held by the substrate holding unit.

11. The substrate processing apparatus of claim 9, wherein the cleaning mechanism is configured to clean the mist guard by supplying a cleaning liquid when the mist guard is located at the second guard height.

12. The substrate processing apparatus of claim 11, wherein the stationary cup body comprises a cylindrical portion of a cylindrical shape and a protruding portion protruded from an upper portion of the cylindrical portion toward an inside of the cylindrical portion, a gap forming portion is provided at a bottom surface of the protruding portion of the mist guard, the gap forming portion forms a first gap between a bottom surface of the gap forming portion and a top surface of the protruding portion of the stationary cup body, a second gap is formed between the top surface of the protruding portion of the stationary cup body and a portion of the mist guard where the gap forming portion is not provided, and the cleaning mechanism comprises a cleaning liquid nozzle configured to supply the cleaning liquid into the second gap.

13. The substrate processing apparatus of claim 1, further comprising:

a cup-shaped constituent component which is provided outside of the stationary cup body in a diametrical direction, wherein the cup-shaped constituent component is not moved with respect to the stationary cup body, wherein a space between the stationary cup body and the cup-shaped constituent component is formed for exhausting liquid or gas.

14. A substrate processing apparatus, comprising:

a substrate holding unit configured to hold a substrate;

at least one processing liquid nozzle configured to discharge a processing liquid onto the substrate held by the substrate holding unit;

a processing vessel configured to accommodate therein the substrate holding unit and the at least one processing liquid nozzle;

a stationary cup body disposed around the substrate holding unit and configured to receive at least the processing liquid or mist of the processing liquid discharged onto the substrate, the stationary cup body not being moved relatively with respect to the processing vessel;

a mist guard provided at an outside of the stationary cup body to surround the stationary cup body and configured to block a liquid scattered outwards beyond a space above the stationary cup body;

a guard elevating mechanism configured to elevate the mist guard to a first guard height and a second guard height lower than the first guard height; and a control unit configured to control the guard elevating mechanism to elevate the mist guard to the first guard height when supplying the processing liquid from the at least one processing liquid nozzle onto the substrate held by the substrate holding unit, and to elevate the mist guard to the second guard height when drying the substrate, wherein the mist guard comprises a cylindrical portion of a cylindrical shape and a protruding portion protruded above the stationary cup body from an upper portion of the cylindrical portion toward an inside of the cylindrical portion, and an air flow is to be formed between the mist guard and the stationary cup body when the mist guard is at the first guard height, and an air flow is to be formed above the mist guard when the mist guard is at the second guard height, wherein the substrate processing apparatus further comprises a cleaning mechanism configured to clean a surface of the mist guard facing the stationary cup body, wherein the cleaning mechanism is configured to clean the mist guard by supplying a cleaning liquid when the mist guard is located at the second guard height, wherein the stationary cup body comprises a cylindrical portion of a cylindrical shape and a protruding portion protruded from an upper portion of the cylindrical portion toward an inside of the cylindrical portion, a gap forming portion is provided at a bottom surface of the protruding portion of the mist guard, the gap forming portion forms a first gap between a bottom surface of the gap forming portion and a top surface of the protruding portion of the stationary cup body, a second gap is formed between the top surface of the protruding portion of the stationary cup body and a portion of the mist guard where the gap forming portion is not provided, and the cleaning mechanism comprises a cleaning liquid nozzle configured to supply the cleaning liquid into the second gap, wherein the gap forming portion is extended along an entire circumference of the protruding portion of the mist guard, a diametrical groove extended in a radial direction and a circumferential groove intersected with the diametrical groove and extended in a circumferential direction are formed at the bottom surface of the gap forming portion, and the cleaning liquid nozzle is provided at a position of the stationary cup body facing the diametrical groove, and the circumferential groove is provided at an inside of the cleaning liquid nozzle in the radial direction.

15. A substrate processing method performed by using a substrate processing apparatus, wherein the substrate processing apparatus comprises:

a substrate holding unit configured to hold a substrate;

at least one processing liquid nozzle configured to discharge a processing liquid onto a top surface of the substrate held by the substrate holding unit;

a processing vessel configured to accommodate therein the substrate holding unit and the at least one processing liquid nozzle;

a stationary cup body disposed around the substrate holding unit and configured to receive the processing liquid or mist of the processing liquid discharged onto the substrate, the stationary cup body not being moved relatively with respect to the processing vessel;

a mist guard provided outside of the stationary cup body to surround the stationary cup body and configured to block a liquid scattered outwards beyond a space above the stationary cup body; and a guard elevating mechanism configured to elevate the mist guard to a first guard height, and to a second guard height lower than the first guard height, wherein the mist guard comprises a cylindrical portion of a cylindrical shape and a protruding portion protruded from an upper end of the cylindrical portion toward the stationary cup body, and wherein the substrate processing method comprises:

supplying the processing liquid onto the substrate held by the substrate holding unit from the at least one processing liquid nozzle in a state that the mist guard is at the first guard height; and drying the substrate in a state that the mist guard is at the second guard height lower than the first guard height, wherein an air flow is to be formed between the mist guard and the stationary cup body when the mist guard is at the first guard height, and an air flow is to be formed above the mist guard when the mist guard is at the second guard height, wherein the substrate processing apparatus further comprises a stationary nozzle configured to discharge a processing liquid from an outside of the mist guard onto the substrate held by the substrate holding unit, and the mist guard is provided with a liquid passage opening through which the processing liquid discharged from the stationary nozzle is allowed to reach the substrate after passing through the mist guard when the mist guard is at the first guard height.

16. The substrate processing method of claim 15, wherein the at least one processing liquid nozzle includes a first processing liquid nozzle and a second processing liquid nozzle, the substrate processing apparatus further comprises a first nozzle arm configured to move the first processing liquid nozzle while holding the first processing liquid nozzle and a second nozzle arm configured to move the second processing liquid nozzle while holding the second processing liquid nozzle, wherein the substrate processing method comprises, as the supplying of the processing liquid onto the substrate, supplying a processing liquid onto the substrate from the first processing liquid nozzle located above the substrate in a state that the second processing liquid nozzle is retreated from above the substrate; and supplying a processing liquid onto the substrate from the second processing liquid nozzle located above the substrate in a state that the first processing liquid nozzle is retreated from above the substrate, and the mist guard is located at a third guard height between the first guard height and the second guard height when performing a nozzle switching operation of advancing the second processing liquid nozzle to a position above the substrate from a position outside the substrate held by the substrate holding unit and retreating the first processing liquid nozzle from the position above the substrate to a position outside the substrate.

* * * * *